(12) United States Patent
Takeuchi et al.

(10) Patent No.: US 10,305,424 B2
(45) Date of Patent: May 28, 2019

(54) SOLAR PHOTOVOLTAIC SYSTEM INSPECTION METHOD AND INSPECTION APPARATUS

(71) Applicant: OMRON Corporation, Kyoto-shi, Kyoto (JP)

(72) Inventors: Tsuyoshi Takeuchi, Aso (JP); Shuichi Misumi, Kyoto (JP); Akihiko Sano, Uji (JP); Kosuke Morita, Tokorozawa (JP)

(73) Assignee: OMRON Corporation, Kyoto-shi (JP)

( * ) Notice: Subject to any disclaimer, the term of this patent is extended or adjusted under 35 U.S.C. 154(b) by 107 days.

(21) Appl. No.: 15/520,177

(22) PCT Filed: Oct. 16, 2015

(86) PCT No.: PCT/JP2015/079303
§ 371 (c)(1),
(2) Date: Apr. 19, 2017

(87) PCT Pub. No.: WO2016/072243
PCT Pub. Date: May 12, 2016

(65) Prior Publication Data
US 2017/0310276 A1 Oct. 26, 2017

(30) Foreign Application Priority Data

Nov. 7, 2014 (JP) .................. 2014-227477

(51) Int. Cl.
*H02S 50/10* (2014.01)
*G01R 31/02* (2006.01)
(Continued)

(52) U.S. Cl.
CPC .............. *H02S 50/10* (2014.12); *G01R 31/02* (2013.01); *G01R 31/26* (2013.01); *G01R 31/28* (2013.01);
(Continued)

(58) Field of Classification Search
CPC ......... H02S 50/10; H02S 30/10; G01R 31/02; G01R 31/26; G01R 31/28
(Continued)

(56) References Cited

U.S. PATENT DOCUMENTS

2010/0222012 A1* 9/2010 Shibuya ................. H04B 1/525
455/79
2012/0286961 A1 11/2012 Komano et al.
(Continued)

FOREIGN PATENT DOCUMENTS

JP   2009-21341 A   1/2009
JP    4604250 B2   1/2011
(Continued)

OTHER PUBLICATIONS

The extended European search report dated Feb. 9, 2018 in a counterpart European Patent application.
(Continued)

*Primary Examiner* — Jeff W Natalini
(74) *Attorney, Agent, or Firm* — Metrolexis Law Group, PLLC

(57) ABSTRACT

A solar photovoltaic system inspection apparatus sequentially applies AC inspection signals to a positive electrode and a negative electrode of a solar cell string, and is provided with: an impedance calculation unit configured to measure an indicator value when the signal is applied to the positive electrode, and an indicator value when the signal is applied to the negative electrode, the indicator values varying depending on the number of solar cell modules from the terminal to which the inspection signal was applied to a failure position; and a control unit configured to obtain the failure position based on the ratio of the indicator value measured when the inspection signal was applied to the positive electrode, to the indicator value measured when the inspection signal was applied to the negative electrode.

17 Claims, 14 Drawing Sheets

(51) Int. Cl.
*G01R 31/26* (2014.01)
*H02S 50/00* (2014.01)
*H02S 30/10* (2014.01)
*G01R 31/28* (2006.01)
*H01L 31/02* (2006.01)
*H01L 31/042* (2014.01)

(52) U.S. Cl.
CPC ...... *H01L 31/02021* (2013.01); *H01L 31/042* (2013.01); *H02S 30/10* (2014.12); *H02S 50/00* (2013.01); *Y02E 10/50* (2013.01)

(58) Field of Classification Search
USPC ...................................................... 324/761.01
See application file for complete search history.

(56) References Cited

U.S. PATENT DOCUMENTS

| | | | |
|---|---|---|---|
| 2013/0088252 A1 | 4/2013 | Brabetz et al. | |
| 2013/0285670 A1 | 10/2013 | Yoshidomi et al. | |
| 2014/0062500 A1 | 3/2014 | Behrends et al. | |
| 2014/0117999 A1 | 5/2014 | Shigemura et al. | |
| 2014/0225444 A1* | 8/2014 | Yoshidomi | H02H 3/16 307/78 |
| 2014/0253138 A1* | 9/2014 | Ishii | H02H 3/16 324/509 |
| 2014/0333340 A1* | 11/2014 | Lynass | H02S 50/00 324/761.01 |
| 2015/0185272 A1* | 7/2015 | Oberzaucher | H02S 50/10 324/761.01 |
| 2015/0188487 A1* | 7/2015 | Yoshidomi | H02S 50/10 324/761.01 |
| 2016/0006392 A1* | 1/2016 | Hoft | H02S 50/10 361/78 |

FOREIGN PATENT DOCUMENTS

| | | |
|---|---|---|
| JP | 2012-84809 A | 4/2012 |
| JP | 2012-119382 A | 6/2012 |
| JP | 2012-238716 A | 12/2012 |
| JP | 2012-256771 A | 12/2012 |
| JP | 2013-33826 A | 2/2013 |
| JP | 2013-527613 A | 6/2013 |

OTHER PUBLICATIONS

The Japanese Office Action (JPOA) dated May 15, 2018 in the counterpart Japanese patent application.

* cited by examiner (a)

(b)

(a)

(b)

(a)

(b)

(c)

(a)

(b)

(c)

US 10,305,424 B2

SOLAR PHOTOVOLTAIC SYSTEM INSPECTION METHOD AND INSPECTION APPARATUS

TECHNICAL FIELD

The present invention relates to a solar photovoltaic system inspection method and an inspection apparatus that inspects whether or not there is a failure in a solar photovoltaic system.

RELATED ART

Conventionally, solar photovoltaic systems are provided with a solar cell string in which a plurality of solar cell modules are connected in series to each other. In such a solar cell string, a solar cell module may fail or a cable that connects the solar cell modules may fail, e.g., may be disconnected. Accordingly, the solar photovoltaic systems need to suitably be inspected as to whether or not there is a failure in the solar cell string, in order to perform stable power supply. For example, disclosures of Patent Documents 1 and 2 are known as techniques for inspecting whether or not there is a failure in a solar cell string.

In the configuration disclosed in Patent Document 1, a "first connection mode" refers to a state in which n solar cell modules are connected in series to each other, an LCR meter is connected to an open end of a first solar cell module, an open end of an n-th solar cell module remains open, and metal frames of the first to the n-th solar cell modules are electrically connected to each other. Furthermore, a "second connection mode" refers to a state in which any adjacent solar cell modules in the first connection mode are disconnected from each other. Furthermore, the solar cell modules in the first and second connection modes are disposed indoors, and the number of solar cell modules to the disconnection position is obtained based on capacitances that were measured in the first connection mode and in the second connection mode by the LCR meter.

Alternatively, the "first connection mode" refers to a state in which the n solar cell modules connected in series to each other are placed on one metal mount, the metal mount is grounded to earth, and the other input end of the LCR meter is grounded to earth. Furthermore, the solar cell modules in the first connection mode and the second connection mode are disposed outside, and the number of solar cell modules to the disconnection position is obtained in a similar manner.

In the configuration disclosed in Patent Document 2, a "first connection mode" refers to a state in which n solar cell modules are connected in series to each other, one output end of a signal generator and one input end of a waveform observation device are connected to an open end of a first solar cell module, an open end of an n-th solar cell module remains open, metal frames of the first to the n-th solar cell modules are electrically connected to each other, and the other output end of the signal generator and the other input end of the waveform observation device are connected to the metal frames. Furthermore, a "second connection mode" refers to a state in which there is a failure or a deteriorated state at a position between the signal generator and the open end in the first connection mode. Furthermore, the solar cell modules in the first and second connection modes are disposed indoors, and a distance Lx from the signal generator to the position at which there is a failure or a deteriorated state is obtained based on observation signals that were observed, in the first and second connection modes, by the waveform observation device with respect to measurement signals output from the signal generator.

Alternatively, the "first connection mode" refers to a state in which the n solar cell modules connected in series to each other are placed on one metal mount, the metal mount is grounded to an earth, and the other output end of the signal generator and the other input end of the waveform observation device are grounded to the earth. Furthermore, the solar cell modules in the first connection mode and the second connection mode are disposed outside, and a distance Lx from the signal generator to the position at which there is a failure or a deteriorated state is obtained in a similar manner.

RELATED ART DOCUMENTS

Patent Documents

Patent Document 1: JP 4604250B (registered on Oct. 15, 2010)

Patent Document 2: JP 2009-021341A (published on Jan. 29, 2009)

Patent Document 3: JP 2012-119382A (Published on Jun. 21, 2012)

Patent Document 4: JP 2013-527613A (published on Jun. 27, 2013)

SUMMARY OF THE INVENTION

Problem to be Solved by the Invention

However, the above-described conventional configurations are each designed to measure in advance a capacitance Cd or an observation signal in a state in which there is no failure (first state) in a solar cell string, in which n solar cell modules are connected in series to each other. Accordingly, if no capacitance Cd or observation signal has been measured in advance, it is neither possible to deal with a case where there is a failure in the solar cell string, nor to easily detect whether or not there is a failure in the solar cell string.

Furthermore, a capacitance to earth that is measured in Patent Document 1 changes daily due to the weather or the like, and thus if a capacitance to earth that was measured in advance is used, highly accurate detection of a failure in the solar cell string (failure position) is not possible.

Accordingly, it is an object of the present invention to provide a solar photovoltaic system inspection method and an inspection apparatus that can perform a failure inspection on a solar cell string easily and with high accuracy.

Means for Solving the Problems

In order to solve the above-described problems, a solar photovoltaic system inspection apparatus of the present invention includes: an inspection signal generation unit configured to generate AC inspection signals; a connection switching unit configured to switch connection of the inspection signal generation unit so that the inspection signals are sequentially applied to a positive electrode of a solar cell string in which a plurality of solar cell modules are connected in series to each other, and to a negative electrode of the solar cell string; an indicator value measurement unit configured to measure an indicator value when the inspection signal is applied to the positive electrode, and an indicator value when the inspection signal is applied to the negative electrode, the indicator values varying depending on the number of solar cell modules from the electrode to which the inspection signal was applied to a failure position; and a failure position determination unit configured to obtain the failure position based on a ratio of the indicator value measured when the inspection signal was applied to the positive electrode, to the indicator value measured when the inspection signal was applied to the negative electrode.

Effects of the Invention

According to the configuration of the present invention, there is no need to measure in advance an indicator value (impedance, for example) in a state in which there is no failure in a solar cell string that is to be inspected, and it is thus possible to obtain a failure position of the solar cell string without using an indicator value (impedance, for example) that was measured in advance, and changes daily due to the weather or the like. This realizes the effect of making it possible to perform a failure inspection on the solar cell string easily and with high accuracy.

EMBODIMENTS OF THE INVENTION

Embodiment 1

Figure 1:
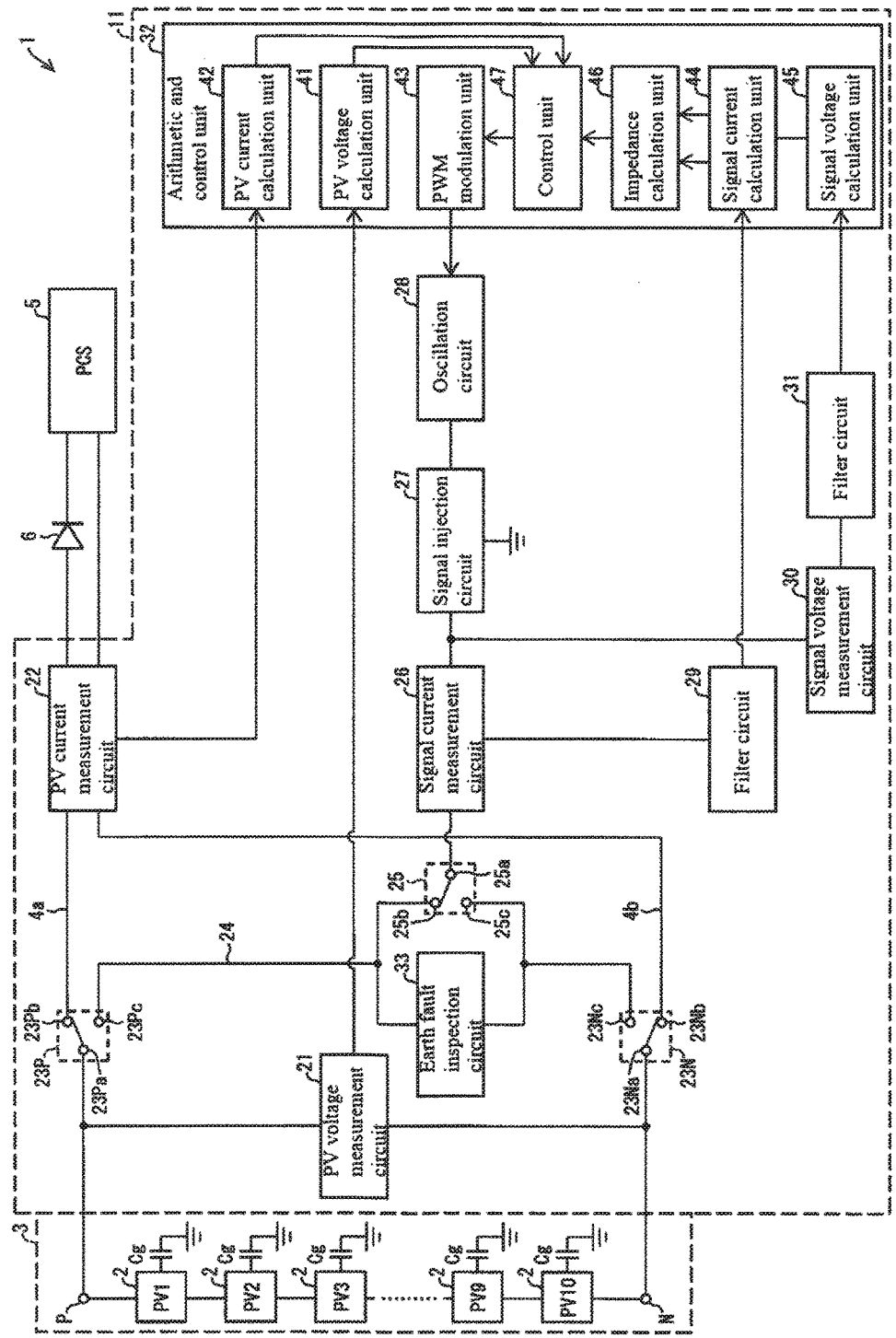
FIG. 1 is a block diagram illustrating a configuration of a solar photovoltaic system that is provided with a solar photovoltaic system inspection apparatus according to an embodiment of the present invention.

Hereinafter, embodiments of the present invention will be described with reference to the drawings. FIG. 1 is a block diagram illustrating a configuration of a solar photovoltaic system 1 that is provided with an inspection apparatus 11 according to an embodiment of the present invention.
Configuration of Solar Photovoltaic System 1

As shown in FIG. 1, the solar photovoltaic system 1 is provided with a solar cell string 3 in which a plurality of solar cell modules 2 are connected in series to each other. The solar cell modules 2 each include a plurality of solar cells connected in series to each other, and are panel-shaped. Electric power generated in the solar cell string 3 is supplied to a power conditioning system (PCS) 5 via electric power carrying paths 4a and 4b, which are electric power line paths. For example, the conducting path 4a is provided with a backflow prevention diode 6. Note that FIG. 1 shows a solar cell string 3 in which 10 solar cell modules 2 are connected in series to each other. A capacitance to earth Cg is generated between each solar cell module 2 and ground.
Configuration of Inspection Apparatus 11

The inspection apparatus 11 inspects whether or not there is a failure in the solar cell string 3, for example, in predetermined intervals such as every day or every few days, or when a predetermined condition is met. Accordingly, the inspection apparatus 11 is provided with a PV voltage measurement circuit (state detection unit, interelectrode measurement unit) 21, a PV current measurement circuit (state detection unit, interelectrode measurement unit) 22, switching relays (path switching units) 23P and 23N, an inspection current path 24, a switching relay (connection switching unit) 25, a signal current measurement circuit (indicator value measurement unit) 26, a signal injection circuit (inspection signal generation unit, frequency adjustment unit) 27, an oscillation circuit (inspection signal generation unit) 28, a filter circuit (filter unit) 29, a signal voltage measurement circuit (indicator value measurement unit) 30, a filter circuit (filter unit) 31, an arithmetic and control unit 32, and an earth fault inspection circuit 33.

PV Voltage Measurement Circuit 21 and PV Current Measurement Circuit 22

The PV voltage measurement circuit 21 measures a voltage between a P terminal and an N terminal of the solar cell string 3, that is, the output voltage of the solar cell string 3. The measurement result is input to the arithmetic and control unit 32. The PV current measurement circuit 22 is provided on the electric power carrying paths 4a and 4b, and measures electric currents that flow through the electric power carrying paths 4a and 4b, that is, the output currents of the solar cell string 3. The measurement result is input to the arithmetic and control unit 32.

Switching Relays 23P and 23N

The switching relays 23P and 23N are provided on the electric power carrying paths 4a and 4b, and switch the path through which the electric power output from the solar cell string 3 is supplied between the PCS 5 side and the inspection current path 24 side. Specifically, the switching relay 23P includes a movable contact 23Pa that is connected to the P terminal of the solar cell string 3, a fixed contact 23Pb that is connected to the PCS5 via the PV current measurement circuit 22, and a fixed contact 23Pc that is connected to the inspection current path 24. Similarly, the switching relay 23N includes a movable contact 23Na that is connected to the N terminal of the solar cell string 3, a fixed contact 23Nb that is connected to the PCS5 via the PV current measurement circuit 22, and a fixed contact 23Nc that is connected to the inspection current path 24.

Switching Relay 25

The switching relay 25 is provided on the inspection current path 24, and switches connection of an input terminal of the signal current measurement circuit 26 between the P terminal side and the N terminal side of the solar cell string 3. Specifically, the switching relay 25 includes a movable contact 25a that is connected to the input terminal of the signal current measurement circuit 26, a fixed contact 25b that is connected to the fixed contact 23Pc of the switching relay 23P via the inspection current path 24, and a fixed contact 25c that is connected to the fixed contact 23Nc of the switching relay 23N via the inspection current path 24.

Oscillation Circuit 28 and Signal Injection Circuit 27

The oscillation circuit 28 produces a signal for use in the signal injection circuit 27, and supplies the generated signal to the signal injection circuit 27. The signal injection circuit 27 generates an AC inspection signal to be injected to the solar cell string 3 based on the signal supplied from the oscillation circuit 28, and supplies the generated inspection signal to the P terminal of the solar cell string 3 via the switching relay 25 and the switching relay 23P. Alternatively, the inspection signal is supplied to the N terminal of the solar cell string 3 via the switching relay 25 and the switching relay 23N.

Inspection Signal

Note that the inspection signal is preferably a sine-wave AC signal, but is not limited to this, and any type of AC signal may be used. Furthermore, the frequency of an inspection signal 51 may be set to between 1 kHz and 1 MHz. An inspection signal 51 of an appropriate frequency selected from the above-described range may be used.

Signal Current Measurement Circuit 26, Filter Circuits 29 and 31, Signal Voltage Measurement Circuit 30

The signal current measurement circuit 26 measures an inspection signal current that is flowing through the solar cell string 3 in a state in which the inspection signal is supplied from the signal injection circuit 27 to the P terminal of the solar cell string 3 (hereinafter, referred to as "P terminal inspection signal application"). Furthermore, the signal current measurement circuit 26 measures an inspection signal current that is flowing through the solar cell string 3 in a state in which the inspection signal is supplied from the signal injection circuit 27 to the N terminal of the solar cell string 3 (hereinafter, referred to as "N terminal inspection signal application").

The filter circuit 29 is a low-pass filter or a bandpass filter, and removes noise components from the inspection signal current measured by the signal current measurement circuit 26. The inspection signal current that was processed by the filter circuit 29 is input to the arithmetic and control unit 32.

The signal voltage measurement circuit 30 measures a voltage of the inspection signal when the inspection signal is applied to the P terminal. Furthermore, the signal voltage measurement circuit 30 measures a voltage of the inspection signal (inspection signal voltage) when the inspection signal is applied to the N terminal.

The filter circuit 31 is a low-pass filter or a bandpass filter, and removes noise components from the inspection signal voltage measured by the signal voltage measurement circuit 30. The inspection signal voltage that was processed by the filter circuit 31 is input to the arithmetic and control unit 32.

Note that the inspection apparatus 11 may also have a configuration in which the filter circuits 29 and 31 are not provided, and the arithmetic and control unit 32 performs, in place of the filter circuits 29 and 31, digital signal processing (filter processing). Furthermore, a configuration is also possible in which electric currents, voltages, and the like that are to be input to the arithmetic and control unit 32 from the PV voltage measurement circuit 21, the PV current measurement circuit 22, the filter circuit 29, and the filter circuit 31 are AD converted by an AD convertor (not shown), and then are input to the arithmetic and control unit 32. Alternatively, the AD conversion may be performed inside the arithmetic and control unit 32.

Arithmetic and Control Unit 32

The arithmetic and control unit 32 is constituted by a microcomputer with a CPU, and includes a PV voltage calculation unit 41, a PV current calculation unit 42, a PWM modulation unit (inspection signal generation unit, frequency adjustment unit) 43, a signal current calculation unit 44, a signal voltage calculation unit 45, an impedance calculation unit (failure position determination unit) 46, and a control unit (connection switching unit, failure position determination unit, first to fifth control units, disconnection determination unit, resistance value measurement unit) 47.

The PV voltage calculation unit 41 converts the output voltage of the solar cell string 3 that was measured by the PV voltage measurement circuit 21 into data suitable for processing in the control unit 47. The PV current calculation unit 42 converts the output current of the solar cell string 3 that was measured by the PV current measurement circuit 22 into data suitable for processing in the control unit 47.

The PWM modulation unit 43 controls the oscillation circuit 28 to adjust the frequency of the signal produced by the oscillation circuit 28 to a frequency that is appropriate for an inspection signal.

The signal current calculation unit 44 converts the inspection signal current that was measured by the signal current measurement circuit 26, and was processed by the filter circuit 29 into data suitable for processing in the impedance calculation unit 46. The signal voltage calculation unit 45 converts the inspection signal voltage that was measured by the signal voltage measurement circuit 30, and was processed by the filter circuit 31 into data suitable for processing in the impedance calculation unit 46.

Based on the data that is provided from the signal current calculation unit 44 and the signal voltage calculation unit 45, the impedance calculation unit 46 obtains the impedance of the solar cell string 3 when the inspection signal is applied to the P terminal, and the impedance of the solar cell string 3 when the inspection signal is applied to the N terminal.

Based on the data that is provided from the PV voltage calculation unit 41 and indicates the output voltage of the solar cell string 3, and the data that is provided from the PV current calculation unit 42 and indicates the output current of the solar cell string 3, the control unit 47 determines whether or not the solar cell string 3 is in an inspectable state, which will be described later. Furthermore, if, as a result of the determination, it is determined that the solar cell string 3 is in the inspectable state, the switching relays 23P and 23N are controlled to connect the solar cell string 3 to the inspection current path 24.

Furthermore, the control unit 47 determines whether or not there is a failure (a cable disconnection or a failure of a solar cell module 2) in the solar cell string 3, and a failure position, if there is a failure, based on the impedance of the solar cell string 3 when the inspection signal is applied to the P terminal, and the impedance of the solar cell string 3 when the inspection signal is applied to the N terminal, the impedances being obtained by the impedance calculation unit 46.

Earth Fault Inspection Circuit 33

The earth fault inspection circuit 33 is configured to inspect whether or not there is an earth fault in the solar cell string 3, and is provided in parallel to the switching relay 25 on the inspection current path 24, for example. When there is an earth fault in the solar cell string 3, it is not possible to accurately obtain impedances Zp and Zn (indicator values) in a failure inspection that is performed on the solar cell string 3. Accordingly, it is not possible to perform the failure inspection on the solar cell string 3 with high accuracy. Therefore, in the failure inspection that is performed on the solar cell string 3, it is preferable to first inspect whether or not there is an earth fault in the solar cell string 3, and to cancel the failure inspection if there is an earth fault.

For the earth fault inspection circuit 33, it is possible to employ a structure according to conventional known methods, for example, one configured as disclosed in Patent Document 3. Alternatively, the earth fault inspection circuit 33 may have a structure as shown in FIG. 2(a).

FIG. 2(a) is a circuit diagram illustrating a configuration of the earth fault inspection circuit (earth fault inspection unit) 33 that is provided on the solar cell string 3. FIG. 2(b) is a circuit diagram obtained by simplifying the circuit diagram of FIG. 2(a). FIG. 3(a) is a circuit diagram illustrating a state in which an earth fault has occurred in the circuit of FIG. 2(a). FIG. 3(b) is a circuit diagram obtained by simplifying the circuit diagram of FIG. 3(a).

As shown in FIGS. 2(a) and 2(b), the earth fault inspection circuit 33 is provided with a resistor R11, a resistor R12, and a current sensor 61. One end of the resistor R11 is connected to the P terminal of the solar cell string 3. One end of the resistor R12 is connected to the N terminal of the solar cell string 3. The other end of the resistor R11 and the other end of the resistor R12 are connected to each other, and are grounded. The current sensor 61 is provided in a ground path of the resistor R11 and the resistor R12.

Note that in the circuits of FIGS. 2(a) and 2(b), if the resistors R11 and R12 are connected to ground throughout an earth fault inspection and a failure inspection that are performed on the solar cell string 3, the impedance is set to a large one that does not affect the failure inspection. Alternatively, a configuration is also possible in which the resistors R11 and R12 are connected to the solar cell string 3 via switches so as to be able to disconnect them from the solar cell string 3 during the failure inspection.

The electric current that was detected by the current sensor 61 is input to the arithmetic and control unit 32. The control unit 47 of the arithmetic and control unit 32 monitors the solar cell string 3 as to whether or not an earth fault has occurred, based on a detection result of the current sensor 61, that is, an electric current detected by the current sensor 61.

As shown in FIGS. 2(a) and 2(b), in a normal time in which no earth fault has occurred in the solar cell string 3, no earth fault current flows through the earth fault inspection circuit 33, and the current sensor 61 detects no electric current. On the other hand, as shown in FIGS. 3(a) and 3(b), if an earth fault has occurred in the solar cell string 3, an earth fault current I11 flows through the earth fault inspection circuit 33, and the current sensor 61 detects the earth fault current I11. Accordingly, the control unit 47 of the arithmetic and control unit 32 determines that an earth fault has occurred based on the detection result of the current sensor 61.

Operation of Solar Photovoltaic System 1

In the above-described configuration, in the solar photovoltaic system 1, when electric power generated in the solar cell string 3 is supplied to the PCS 5, the movable contact 23Pa of the switching relay 23P is switched to the fixed contact 23Pb side, and the movable contact 23Na of the switching relay 23N is switched to the fixed contact 23Nb side.

Operation of Inspection Apparatus 11

Overview of Operation of Inspection Apparatus 11

The inspection apparatus 11 inspects the solar cell string 3 when the solar cell string 3 is under a predetermined condition in which the solar cell string 3 can be inspected (hereinafter, referred to as "inspectable state"). In this case, the control unit 47 monitors the solar cell string 3 in order to determine whether the solar cell string 3 is in the inspectable state. Specifically, the control unit 47 monitors the output voltage of the solar cell string 3 that was measured by the PV voltage measurement circuit 21 and was provided from the PV voltage calculation unit 41, and the output current of the solar cell string 3 that was measured by the PV current measurement circuit 22 and was provided from the PV current calculation unit 42.

The inspection apparatus 11 performs an inspection of whether or not an earth fault has occurred in the solar cell string 3, and performs a failure inspection on the solar cell string 3. Here, the failure inspection is a search for a cable disconnection in the solar cell string 3, and a failure of a solar cell module 2. In the failure inspection that is performed on the solar cell string 3, the inspection apparatus 11 obtains an impedance Zp of the solar cell string 3 when the inspection signal is applied to the P terminal, and an impedance Zn of the solar cell string 3 when the inspection signal is applied to the N terminal. Also, based on the ratio of the impedance Zp to the impedance Zn, the inspection apparatus 11 detects whether or not there is a cable disconnection in the solar cell string 3, whether or not there is a failure in a solar cell module 2, and positions of the cable disconnection and the faulty solar cell module 2.

Inspectable State of Solar Cell String 3

In the present embodiment, the inspectable state of the solar cell string 3 refers to a state in which the solar cell string 3 generates electric power, and the electric power production (output current) is not greater than a predetermined threshold. Here, if the solar cell string 3 is in the inspectable state, and a prescribed inspection time has come, the control unit 47 controls the switching relays 23P and 23N to switch the movable contact 23Pa of the switching relay 23P to the fixed contact 23Pc side, and switch the movable contact 23Na of the switching relay 23N to the fixed contact 23Nc side. Accordingly, the P terminal and the N terminal of the solar cell string 3 are connected to the inspection current path 24.

Figure 4:
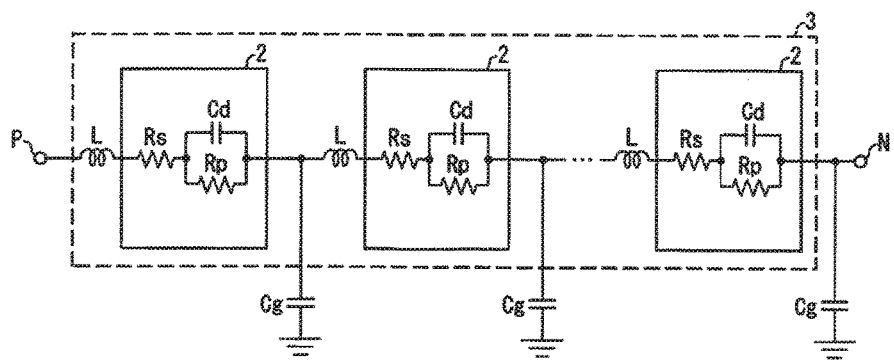
FIG. 4 is a circuit diagram of an equivalent circuit illustrating the solar cell string with "R", "L", and "C", when the solar cell string shown in FIG. 1 does not generate electric power.
Figure 5:
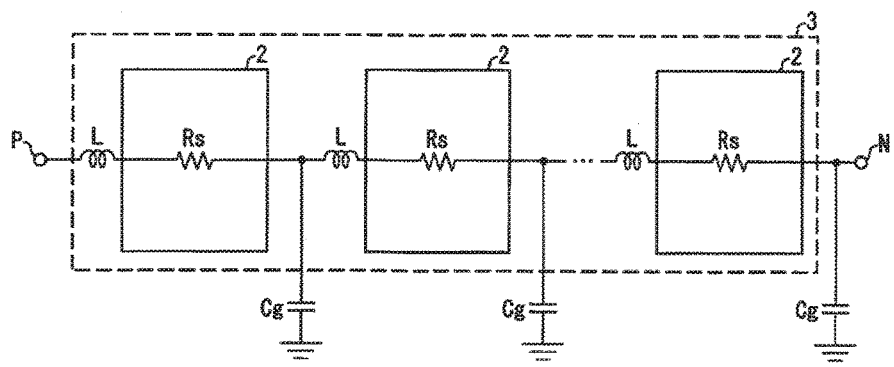
FIG. 5 is a circuit diagram of an equivalent circuit of the solar cell string shown in FIG. 1 when the solar cell string generates electric power, the circuit diagram corresponding to FIG. 4.

The following will describe the reason why the inspectable state refers to the state in which the solar cell string 3 generates electric power, and the electric power production is not greater than a predetermined threshold. FIG. 4 is a circuit diagram of an equivalent circuit showing the solar cell string 3 with "R", "L", and "C", when the solar cell string 3 does not generate electric power. FIG. 5 is a circuit diagram of an equivalent circuit of the solar cell string 3 when the solar cell string 3 generates electric power, the circuit diagram corresponding to FIG. 4.

When the solar cell string 3 does not generate electric power, as shown in FIG. 4, the solar cell modules 2 each include a serial resistance Rs, a junction capacitance Cd at a pn junction, and a parallel resistance Rp. Furthermore, "L" is an inductance of a line that connects the solar cell modules 2, and "Cg" is a capacitance to earth Cg of the solar cell modules 2.

On the other hand, while the solar cell string 3 generates electric power, as shown in FIG. 5, the solar cell modules 2 each include only the serial resistance Rs. The serial resistance Rs in this case has a very small value such as a value that is not greater than 1Ω, for example. Furthermore, the inductance L also has a very small value relative to the capacitance to earth Cg. Accordingly, while the solar cell string 3 generates electric power, it is possible to accurately obtain the impedance Zp of the solar cell string 3 when the inspection signal is applied to the P terminal, and the impedance Zn of the solar cell string 3 when the inspection signal is applied to the N terminal.

Furthermore, the state in which the electric power production of the solar cell string 3 is not greater than a predetermined threshold is a state in which the electric power production is low to the extent that occurrence of an arc does not affect switching of the switching relays 23P and 23N from the state in which the solar cell string 3 is connected to the PCS 5 to the state in which the solar cell string 3 is connected to the inspection current path 24. Accordingly, as a result of such conditions being set as the conditions of the inspectable state, it is possible to use switching relays 23P and 23N that are inexpensive and withstand a low voltage, making it possible to perform the switching operation easily and safely.

Flow of Operation of Inspection apparatus 11

Figure 6:
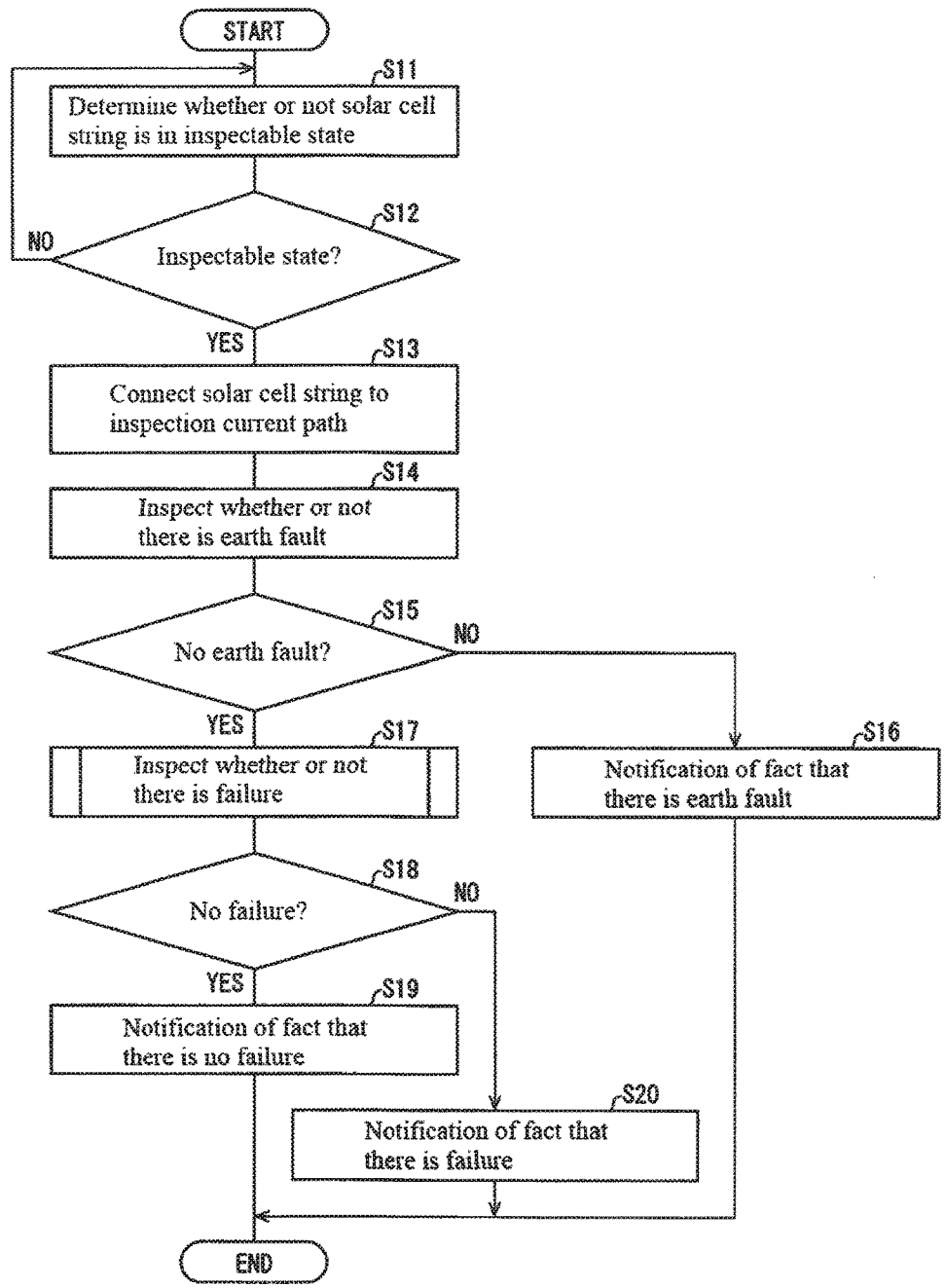
FIG. 6 is a flowchart of an operation of the inspection apparatus shown in FIG. 1.

FIG. 6 is a flowchart showing the operation of the inspection apparatus 11. When inspecting the solar cell string 3, the inspection apparatus 11 determines whether or not the solar cell string 3 is in the inspectable state (in which the solar cell string 3 generates electric power, and the electric power production is not greater than a predetermined threshold) (step S11). Whether or not the solar cell string 3 is in the inspectable state is determined by the control unit 47 of the arithmetic and control unit 32, based on an output voltage of the solar cell string 3 that is detected by the PV voltage measurement circuit (state detection unit) 21, and an output current of the solar cell string 3 that is detected by the PV current measurement circuit (state detection unit) 22.

If, as a result of the determination, it is determined that the solar cell string 3 is in the inspectable state (step S12), the control unit 47 controls the switching relays 23P and 23N to connect the solar cell string 3 to the inspection current path 24 (step S13).

Then, the inspection apparatus 11 inspects, using the earth fault inspection circuit 33, whether or not an earth fault has occurred in the solar cell string 3 (step S14). If, as a result of the inspection in step S14, it is determined that an earth fault has occurred (step S15), the inspection apparatus 11 notifies, for example, a management device (not shown) of the solar photovoltaic system 1 of the fact that an earth fault has occurred in the solar cell string 3 (step S16). Then, the inspection apparatus 11 ends the operation without performing a failure inspection on the solar cell string 3. On the other hand, if, as a result of the inspection in step S14, it is determined that no earth fault has occurred (step S15), the inspection apparatus 11 performs a failure inspection (inspection of whether or not there is a failure) on the solar cell string 3 (step S17).

If, as a result of the failure inspection in step S17, it is determined that there is no failure in the solar cell string 3, the inspection apparatus 11 notifies the management device of that fact (step S19), and then ends the procedure. On the other hand, if, as a result of the failure inspection in step S17, it is determined that there is a failure in the solar cell string 3, the inspection apparatus 11 notifies the management device of that fact (step S20), and then ends the procedure.

Flow of Failure Inspection

Figure 7:
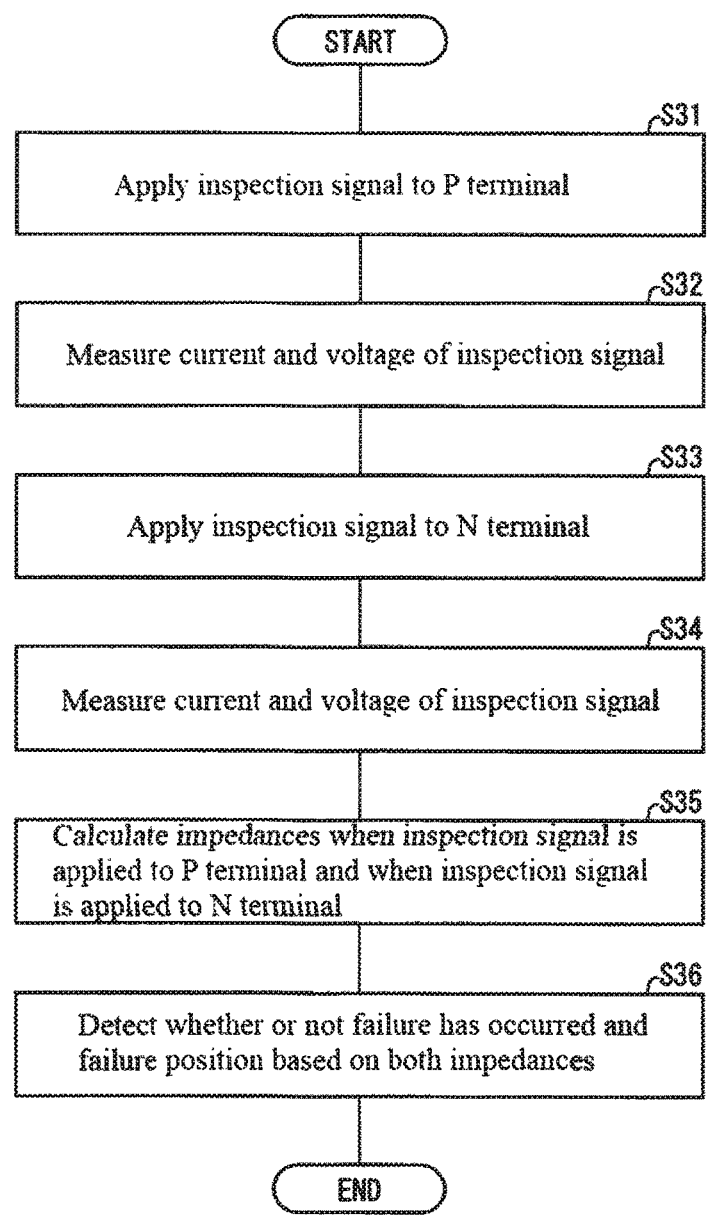
FIG. 7 is a flowchart illustrating a flow of step S17, in FIG. 6, of inspecting whether or not there is a failure in the solar cell string.

FIG. 7 is a flowchart illustrating a flow of step S17 of the failure inspection that is performed on the solar cell string 3 by the inspection apparatus 11.

In the failure inspection that is performed on the solar cell string 3, the inspection apparatus 11 sequentially applies inspection signals to the P terminal and to the N terminal (steps S31 and S33). The steps are performed in no particular order. The signal current measurement circuit 26 measures, in both cases, inspection signal currents flowing through the solar cell string 3 (steps S32 and S34). Similarly, the signal voltage measurement circuit 30 measures, in both cases, inspection signal voltages (steps S32 and S34).

Then, based on the inspection signal current and the inspection signal voltage that were obtained in step S32 when the inspection signal was applied to the P terminal, the impedance calculation unit 46 of the arithmetic and control unit 32 obtains an impedance Zp of the solar cell string 3 when the inspection signal was applied to the P terminal. Furthermore, based on the inspection signal current and the inspection signal voltage that were obtained in step S34 when the inspection signal was applied to the N terminal, the impedance calculation unit 46 obtains an impedance Zn of the solar cell string 3 when the inspection signal was applied to the N terminal (step S35). Note that an impedance analyzer may be used for the impedance measurement.

Then, the control unit 47 of the arithmetic and control unit 32 obtains, based on the ratio of the impedance Zp to the impedance Zn that were obtained in step S35, whether or not there is a failure (whether or not there is a cable disconnection, or a failure of a solar cell module 2) in the solar cell string 3, and a failure position (the position at which the cable disconnection has occurred, or the position at which a solar cell module 2 has failed) (step S36).

Operation of Failure Position Detection

Figure 8:
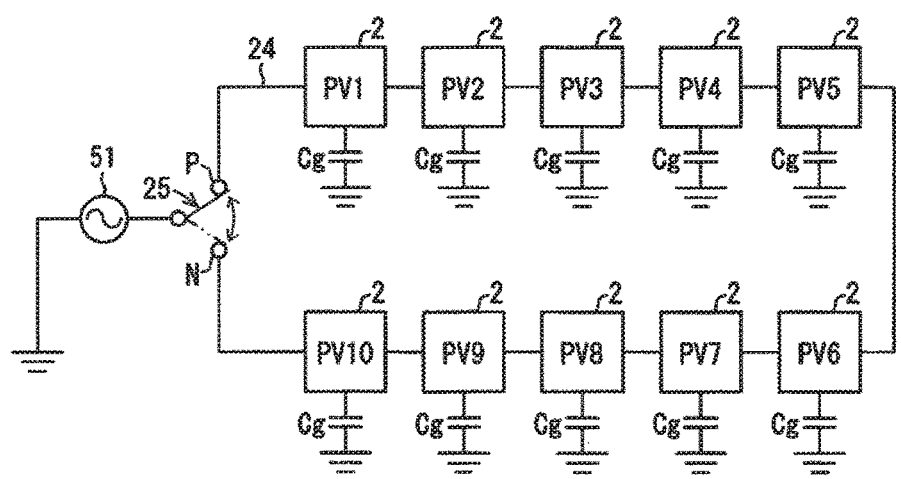
FIG. 8 is a circuit diagram schematically illustrating an example of a state in which the solar cell string inspection apparatus shown in FIG. 1 performs a failure inspection.

FIG. 8 is a circuit diagram schematically showing an example of a state in which the inspection apparatus 11 performs a failure inspection on the solar cell string 3. In the example of FIG. 8, a failure has occurred in the seventh solar cell module 2 (PV7) when seen from the P terminal side. In FIG. 8, when an inspection signal is to be applied to the P terminal, the switching relay 25 is switched so that the inspection signal 51 is applied to the P terminal of the solar cell string 3. Similarly, when an inspection signal is to be applied to the N terminal, the switching relay 25 is switched so that the inspection signal 51 is applied to the N terminal of the solar cell string 3.

A result of the impedance calculation that was performed based on the example of FIG. 8 by the impedance calculation unit 46 of the arithmetic and control unit 32, and a result of the determination of whether or not there is a failure in the solar cell string 3 that is performed based on the example of FIG. 8 by the control unit 47 are as follows.

The impedance Zp of the solar cell string 3 when an inspection signal is applied to the P terminal, and the impedance Zn of the solar cell string 3 when an inspection signal is applied to the N terminal are given as:

$Zp=949\Omega$, and $Zn=1542\Omega$

The reason why the impedances Zp and Zn have different values is that there is a failure in the solar cell string 3, and the impedances Zp and Zn have the same value if there is no failure.

Furthermore, the impedances Zp and Zn have numerical values that correspond to the position of a faulty solar cell module 2. In this case, the impedance indicating a failure position in the solar cell string 3 is smaller as the faulty solar cell module 2 is located further away from the terminal (the P terminal or the N terminal) to which the inspection signal 51 is applied. Accordingly, the failure position is obtained by calculating the ratios of $Zn/(Zp+Zn)$ to $Zp/(Zp+Zn)$. That is, because $Zp+Zn=2491\Omega$ is satisfied, $Zn/(Zp+Zn):Zp/(Zp+Zn)$ is given as $Zn/(Zp+Zn):Zp/(Zp+Zn)=1542/2491:949/2491=0.62:0.38$. Furthermore, because the number of solar cell modules 2 is 10, $Zn/(Zp+Zn):Zp/(Zp+Zn)=0.62\times10:0.38\times10=6.2:3.8$ is given. This means that 6.2 is the value counted from the P terminal side, and thus the failure position in the solar cell string 3 is located between the sixth and seventh solar cell modules. On the other hand, 3.8 is the value counted from the N terminal side, and thus the failure position in the solar cell string 3 is located between the eighth and seventh solar cell modules. Accordingly, the seventh solar cell module 2 from the P terminal side is determined as the failure position.

Advantages of Failure Inspection Performed During Power Generation of Solar Cell String 3

FIG. 9(a) is a circuit diagram obtained by simplifying the equivalent circuit (equivalent circuit when the solar cell string 3 generates electric power) of FIG. 5 when the solar cell string 3 has not failed. That is, if the solar cell string 3 has not failed, the equivalent circuit of FIG. 5 can be shown as in FIG. 9(a) in which the serial resistances Rs that have low resistances, and the inductances L that have low impedances are omitted. Note that in FIG. 9(a), the capacitance to earth Cg of the solar cell string 3 is given as m0 (m0=10)× Cg.

On the other hand, as shown in the example of FIG. 8, the seventh solar cell module 2 (PV7) from the P terminal side in the solar cell string 3 has failed, the equivalent circuit of FIG. 5 can be shown as in FIGS. 9(b) and 9(c). FIG. 9(b) is a circuit diagram showing the equivalent circuit of FIG. 8 when an inspection signal is applied to the P terminal. FIG. 9(c) is a circuit diagram showing the equivalent circuit of FIG. 8 when an inspection signal is applied to the N terminal.

Note that in FIG. 9(b), CgP1 is a capacitance to earth Cg between the first solar cell module 2 (PV7) from the P terminal side to the solar cell module 2 (PV6) located before the faulty solar cell module 2 (PV7), and is given as CgP1=m1 (m1=6)×Cg. CgP2 is a capacitance to earth Cg between the next solar cell module 2 (PV8) from the P terminal side, which is located after the faulty solar cell module 2 (PV7), and the last solar cell module 2 (PV10), and is given as CgP2=m2 (m2=3)×Cg.

Furthermore, in FIG. 9(c), CgN1 is a capacitance to earth Cg between the first solar cell module 2 (PV10) from the N terminal side, and the solar cell module 2 (PV8) located before the faulty solar cell module 2 (PV7), and is given as CgN1=m1 (m1=3)×Cg. CgN2 is a capacitance to earth Cg between the next solar cell module 2 (PV6) from the N terminal side, which is located after the faulty solar cell module 2 (PV7), and the last solar cell module 2 (PV1), and is given as CgN2=m2 (m2=6)×Cg.

In FIG. 9(b), if there is a failure in a solar cell module 2, the resistance value of the serial resistance Rs of this solar cell module 2 is a large value such as a few hundred $\Omega$ to a few thousand $\Omega$, for example. Accordingly, the electric current that flows through the solar cell string 3 due to the inspection signal 51 is almost an electric current Ip1, which flows through CgP1, and an electric current Ip2, which flows through CgP2, is small. Similarly, in FIG. 9(c), the electric current that follows through the solar cell string 3 due to the inspection signal 51 is almost an electric current In1, which flows through CgN1, and an electric current In2, which flows through Cgn2, is small.

Accordingly, the impedance Zp can be regarded as an impedance that is caused only by CgP1, and the impedance Zn can be regarded as an impedance that is caused only by CgN1. Accordingly, when a failure inspection is performed on the solar cell string 3 while the solar cell string 3 generates electric power, it is possible to detect, with high accuracy, whether or not there is a failure in the solar cell string 3, and a failure position in solar cell string 3.

Operation of Detecting Cable Disconnection of Solar Cell Modules 2

Figure 10:
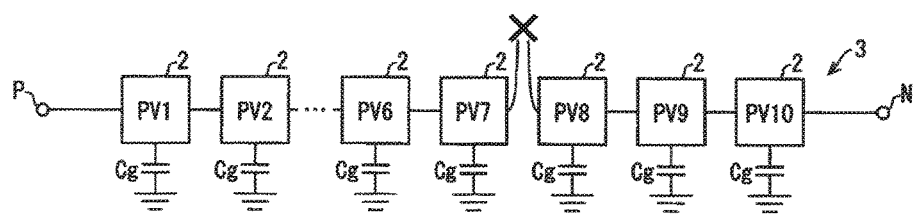
FIG. 10 is a diagram illustrating an example of a state in the inside of the solar cell string shown in FIG. 1 in which a cable that connects solar cell modules is disconnected.

FIG. 10 is a circuit diagram showing an example of a state in the inside of the solar cell string 3 in which a cable that connects the solar cell modules 2 to each other is disconnected.

As shown in FIG. 10, if a cable disconnection has occurred in the solar cell string 3, an interelectrode voltage (output voltage of the solar cell string 3) between the P terminal and the N terminal of the solar cell string 3 that is measured by the PV voltage measurement circuit 21 is substantially 0V. Similarly, the output current of the solar cell string 3 that is measured by the PV current measurement circuit 22 is substantially 0A.

Accordingly, the control unit 47 of the arithmetic and control unit 32 can determine that a cable disconnection of the solar cell modules 2 has occurred in the solar cell string 3 when the interelectrode voltage of the solar cell string 3 or the output current of the solar cell string 3 is measured, and the measured value indicates a cable disconnection. Specifically, the control unit 47 compares, for example, the measured value with a predetermined threshold, and determines that there is a cable disconnection if the measured value is less than the threshold for a certain period.

Note that the threshold may be set as, for example, a lower limit for the measured values that indicate that there is no cable disconnection. Furthermore, the reason why it is determined that there is a cable disconnection if the measured value is less than the threshold for a for a certain period is to reliably perform the detection of a cable disconnection by eliminating the case where a measured value instantaneously falls under the threshold due to some circumstances.

Furthermore, if an output current of the solar cell string 3 is used to detect a cable disconnection, the switching relays 23P and 23N are switched from the state in which the solar cell string 3 is connected to the PCS5, to the state in which the solar cell string 3 is connected to the inspection current path 24, and then the PV current measurement circuit 22 performs the detection.

Operation of Detecting Position of Cable Disconnection of Solar Cell Modules 2

If a cable disconnection of the solar cell modules 2 has been detected by an operation of detecting a cable disconnection of the solar cell modules 2, the operation of detecting the position of the cable disconnection of the solar cell modules 2 is performed.

The detection operation in this case is the same as the above-described detection operation for detecting a failure position (faulty solar cell module 2) in the solar cell string 3. That is, inspection signals are applied to the P terminal of the solar cell string 3, and to the N terminal of the solar cell string 3, impedances Zp and Zn in the respective cases are obtained, and a cable disconnection position is detected by calculating Zn/(Zp+Zn):Zp/(Zp+Zn).

Figure 11:
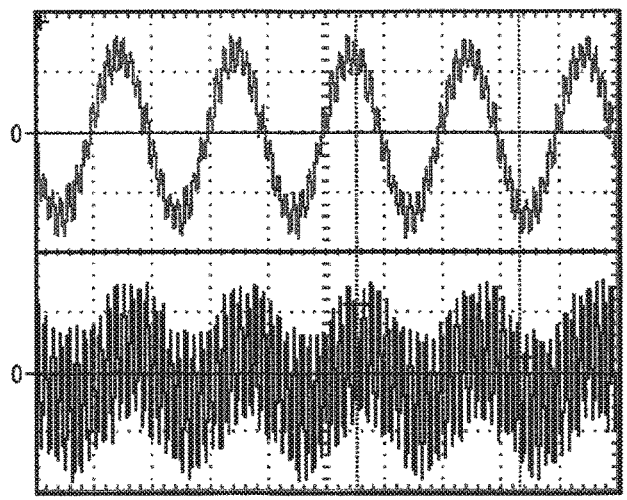
FIG. 11 illustrates waveform charts of, when an inspection signal is applied to the P terminal by the inspection apparatus shown in FIG. 1, inspection signal voltages that were measured at the position at which the signal is applied (upper half), and inspection signal voltages that were measured at an end position (lower half).
Figure 12:
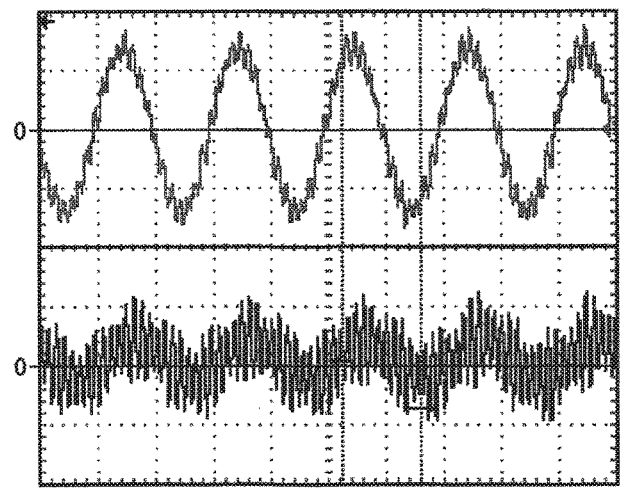
FIG. 12 illustrates waveform charts of, when an inspection signal is applied to the N terminal by the inspection apparatus shown in FIG. 1, inspection signal voltages that were measured at the position at which the signal is applied (upper half), and inspection signal voltages that were measured at an end position (lower half).

Advantage of Subjecting Inspection Signal Current and Inspection Signal Voltage to Filter Processing FIG. 11 illustrates waveform charts of, when an inspection signal is applied to the P terminal, inspection signal voltages that were measured at the position at which the signal is applied (upper half), and inspection signal voltages that were detected at an end position (lower half). FIG. 12 illustrates waveform charts of, when an inspection signal is applied to the N terminal, inspection signal voltages that were measured at the position at which the signal is applied (upper half), and inspection signal voltages that were detected at an end position (lower half).

As shown in FIGS. 11 and 12, the waveform of the inspection signal voltages at the end position is such that noise is added to the waveform of the inspection signal voltages at the position at which the signal is applied. Accordingly, it is preferable to subject the currents (inspection signal currents) and the voltages (inspection signal voltages) of the inspection signal that were obtained at the end position to filter processing for removing the noise components therefrom, and then to use the obtained inspection signal currents and inspection signal voltages for impedance calculation in the impedance calculation unit 46. Accordingly, it is possible to accurately obtain the impedances Zp and Zn. As a result, it is possible to perform a failure inspection on the solar cell string 3 using the inspection apparatus 11 with high accuracy.

Figure 9:
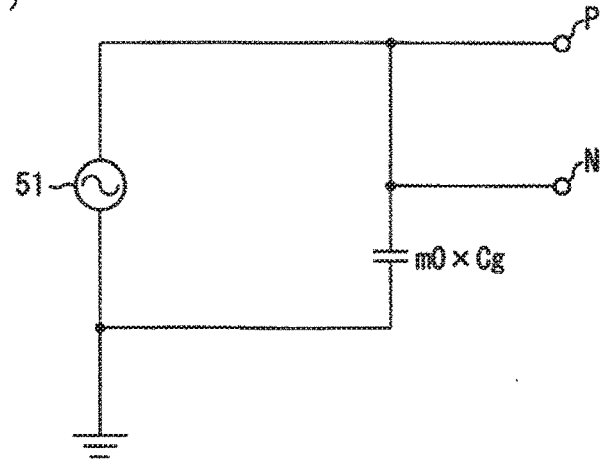
FIG. 9(a) is a circuit diagram obtained by simplifying the equivalent circuit of FIG. 5, when the solar cell string shown in FIG. 1 has not failed.
FIG. 9(b) is a circuit diagram illustrating the equivalent circuit of FIG. 8, when an inspection signal is applied to a P terminal.
FIG. 9(c) is a circuit diagram illustrating the equivalent circuit of FIG. 8 when an inspection signal is applied to an N terminal.
Figure 9:
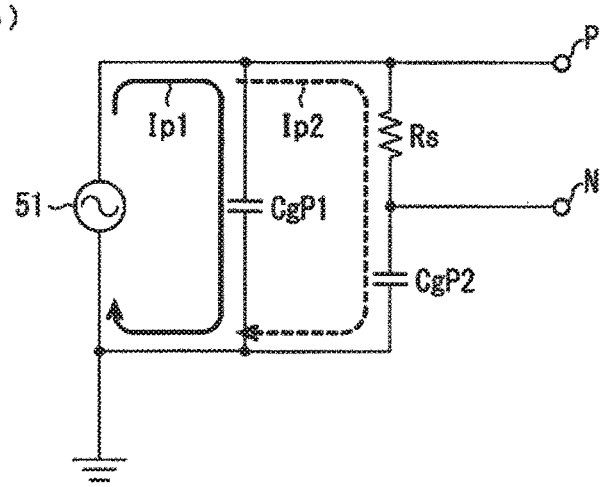
Figure 9:
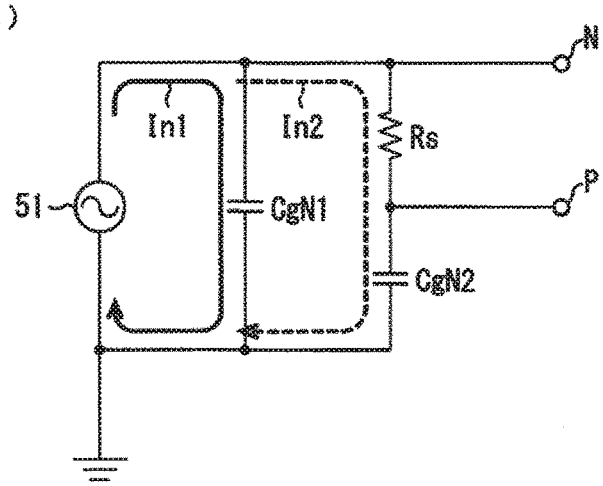

Note that, for example, FIGS. 8 and 9 show that the inspection signal 51 (inspection signal source) and the solar cell modules 2 are grounded to the same target. However, the solar cell modules 2 do not need to be grounded to the same target as that of the inspection signal 51. In other words, the solar photovoltaic system 1 includes a variety of modes (variety of ground modes), and the inspection apparatus 11 of the present embodiment and inspection apparatuses 11 shown in embodiments below are also applicable to failure inspections of the solar cell string 3 using any mode of the solar photovoltaic system 1. For example, the ground mode for the solar cell modules 2 of the solar cell string 3 may be such that, for example, the solar cell modules 2 are grounded to frames, to an earth, or to the capacity of air, and the inspection apparatus 11 may perform a failure inspection on the solar cell string 3 without being affected by the ground mode of the solar photovoltaic system 1.

Embodiment 2

Figure 13:
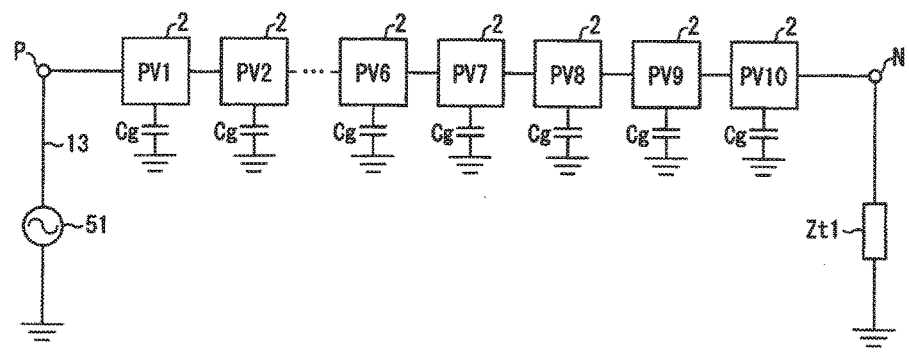
FIG. 13 is a circuit diagram schematically illustrating a state in which a failure inspection is performed on the solar cell string by an inspection apparatus according to another embodiment of the present invention.

Configuration in which Terminal Impedance for Protection Against Noise is Arranged The following will describe another embodiment of the present invention with reference to the drawing. FIG. 13 is a circuit diagram schematically illustrating a state in which a failure inspection is performed on the solar cell string 3 by an inspection apparatus 11 according to the present embodiment.

FIG. 13 shows a case where an inspection signal is applied to the P terminal, and the N terminal is grounded via a terminal impedance Zt1. Similarly, in a case where an inspection signal is applied to the N terminal, the P terminal, which is an end terminal, is grounded via the terminal impedance Zt1 (not shown).

According to the above-described configuration, in the failure inspection that is performed on the solar cell string 3, noise is not likely to be added to an inspection signal, since the P terminal or the N terminal of the solar cell string 3 that is opposite to the terminal to which the inspection signal is applied is grounded via the terminal impedance Zt1. Accordingly, the impedances Zp and Zn that are obtained by measuring the inspection signal current and the inspection signal voltage are accurate.

Note that the terminal impedance Zt1 may employ an impedance element such as a capacitor, a resistor, or an inductance that generates an impedance.

Embodiment 3

Figure 14:
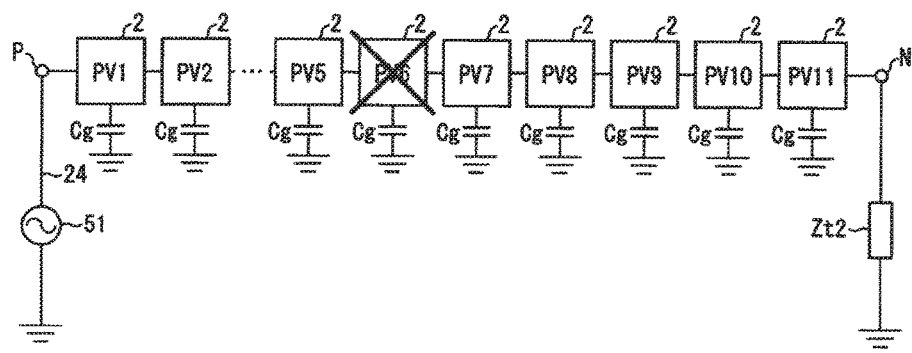
FIG. 14 is a circuit diagram schematically illustrating a state in which a failure of the solar cell string has been detected by an inspection apparatus according to yet another embodiment of the present invention.

Configuration in which Terminal Impedance is Arranged for Prevention of Failure in Central Position The following will describe yet another embodiment of the present invention with reference to the drawing. FIG. 14 is a circuit diagram schematically illustrating a state in which a failure inspection is performed on the solar cell string 3 by an inspection apparatus 11 of the present embodiment (state in which a faulty solar cell module 2 has been detected). Note that FIG. 14 shows a case where an inspection signal is applied to the P terminal, and the solar cell module 2 that is located at a central position, when seen from the P terminal side and the N terminal side of the solar cell string 3, has failed.

As described above, if there is neither a cable disconnection nor a failure in the solar cell string 3, the impedance Zp measured when the inspection signal is applied to the P terminal and the impedance Zn measured when an inspection signal is applied to the N terminal have the same values.

On the other hand, also if, for example, the solar cell string 3 includes an odd number of solar cell modules 2 connected in series to each other, and the solar cell module 2 that is located at the central position, when seen from the P terminal side and the N terminal side, has failed, similarly, the impedance Zp measured when the inspection signal is applied to the P terminal and the impedance Zn measured when the inspection signal is applied to the N terminal have the same value.

Accordingly, in such a case, an additional impedance Zt2 is connected to the P terminal or N terminal that is opposite to the terminal to which the inspection signal is applied, and this terminal is grounded via the additional impedance Zt2. Accordingly, the impedances Zp and Zn are off-balance for the additional impedance Zt2, and have different values. In other words, if the additional impedance Zt2 is connected and the impedances Zp and Zn have different values from each other, it is possible to detect that the solar cell module 2 that is located at the central position, when seen from the P terminal side and the N terminal side, has failed.

Note that the terminal impedance Zt2 may employ an impedance element such as a capacitor, a resistor, or an inductance that generates an impedance.

Embodiment 4

Configuration Handling Multiple Failure Positions

Figure 15:
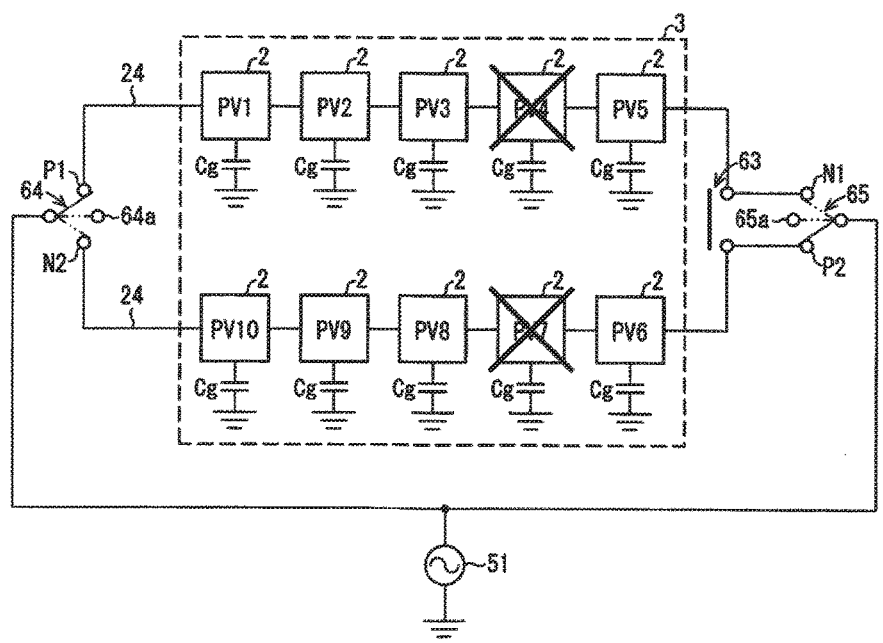
FIG. 15 is a circuit diagram schematically illustrating a state in which failure positions in the solar cell string have been detected by an inspection apparatus according to yet another embodiment of the present invention.

The following will describe yet another embodiment of the present invention with reference to the drawing. FIG. 15 is a circuit diagram schematically illustrating a state in which a failure inspection is performed on the solar cell string 3 by an inspection apparatus 11 according to the present embodiment (state in which faulty solar cell modules 2 have been detected).

The inspection apparatus 11 of the present embodiment is configured to be able to detect multiple failure positions in the solar cell string 3. Accordingly, as shown in FIG. 15, the solar cell string 3 is provided with a cutout relay (string separation switching unit) 63 that switches a cable that connects the solar cell modules 2 between non-conduction and conduction, in an intermediate position of that cable, for example. In other words, the cutout relay 63 is configured to switch the cable between non-conduction and conduction between an intermediate N terminal (N1 terminal), which is the N terminal of the fifth solar cell module 2 (PV5) from the P side, and an intermediate P terminal (P2 terminal), which is the P terminal of the sixth solar cell module 2 (PV6), in the solar cell string 3 in which, for example, 10 solar cell modules 2 are connected in series to each other.

Note that the position at which the cutout relay 63 is provided is not limited to an intermediate position of the solar cell string 3, and may be any appropriate position midway in the solar cell string 3.

Furthermore, corresponding to the configuration of the solar cell string 3 as described above, the inspection apparatus 11 is provided with switching relays (connection switching units) 64 and 65, in place of the switching relay 25. The switching relay 64 performs switching between "P1 terminal inspection signal application", in which the inspection signal 51 is applied to the P1 terminal that is the original P terminal of the solar cell string 3, and "N2 terminal inspection signal application", in which the inspection signal 51 is applied to the N2 terminal that is the original N terminal. The switching relay 65 performs switching between "P2 terminal inspection signal application", in which the inspection signal 51 is applied to a P1 terminal that is an intermediate P terminal of the solar cell string 3, and "N1 terminal inspection signal application", in which the inspection signal 51 is applied to an N1 terminal that is an intermediate N terminal.

Operation of Inspection Apparatus 11

In the above-described configuration, the first solar cell module 2 (PV1) to the fifth solar cell module 2 (PV5), when seen from the P side, of the solar cell string 3 of FIG. 15 can be regarded as a single solar cell string (first smaller string), and the sixth solar cell module 2 (PV6) to the tenth solar cell module 2 (PV10) can be regarded as a single solar cell string (second smaller string). These first and second smaller strings are subjected to the above-described failure inspection that is performed on the solar cell string 3, in a similar manner. Accordingly, even if there are failure positions in the respective first and second smaller strings, it is possible to detect the failure positions.

Note that, in an inspection on the first smaller string, when the inspection signal is applied to the P1 terminal, the switching relay 64 is switched to the P1 terminal, and the switching relay 65 is switched to a non-connection terminal 65a. Furthermore, when the inspection signal is applied to the N1 terminal, the switching relay 65 is switched to the N1 terminal, and the switching relay 64 is switched to a non-connection terminal 65a. Similarly, in an inspection on the second smaller string, when the inspection signal is applied to the P2 terminal, the switching relay 65 is switched to the P2 terminal, and the switching relay 64 is switched to the non-connection terminal 64a. Furthermore, when the inspection signal is applied to the N2 terminal, the switching relay 64 is switched to the N2 terminal, and the switching relay 65 is switched to the non-connection terminal 65a.

Embodiment 5

Configuration in which Voltage of Inspection Signal 51 is Set to Voltage Suitable for Failure Inspection The following will describe yet another embodiment of the present invention with reference to the drawings. FIG. 16(a) is a circuit diagram illustrating a solar cell module 2 shown in FIG. 1 with solar cells 71 and a bypass diode 72.

In the present embodiment, the inspection apparatus 11 is configured to apply a signal of a very small voltage that is not affected by the bypass diode of the solar cell module 2, the signal serving as an inspection signal to be supplied from the signal injection circuit 27 to the solar cell string 3.

As shown in FIG. 16(a), in the solar cell module 2, a plurality of solar cells 71 are connected in series to each other, and a bypass diode 72 is connected in parallel to the plurality of solar cells 71 connected in series to each other. An anode of the bypass diode 72 is connected to a negative electrode of the solar cell module 2, and a cathode of the bypass diode 72 is connected to a positive electrode of the solar cell module 2.

Figure 16:
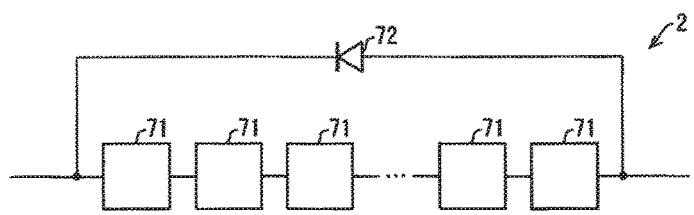
FIG. 16(a) is a circuit diagram illustrating a solar cell module shown in FIG. 1 with solar cells and a bypass diode.
FIG. 16(b) is a circuit diagram obtained by adding the bypass diodes to the circuit of FIG. 4.
FIG. 16(c) is a circuit diagram obtained by adding the bypass diodes to the circuit of FIG. 5.
Figure 16:
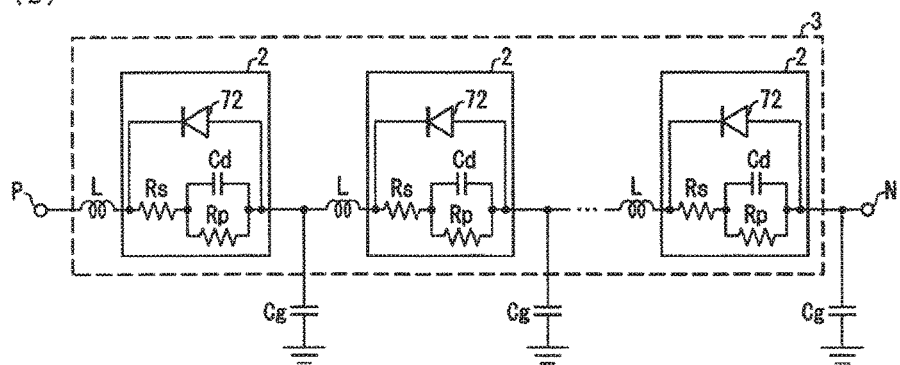
Figure 16:
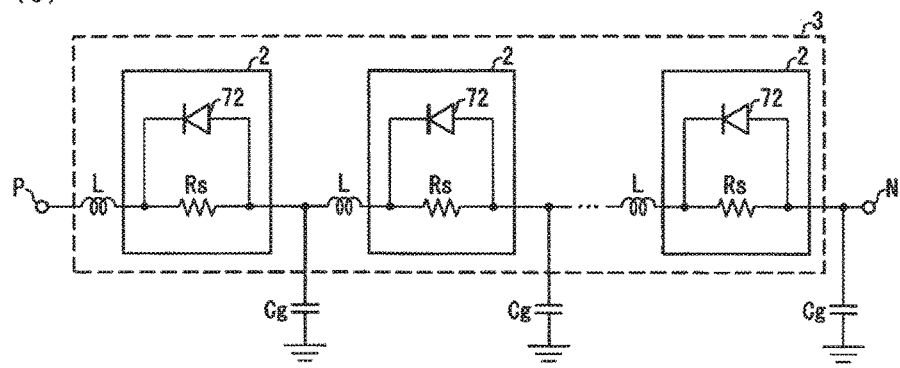
Figure 17:
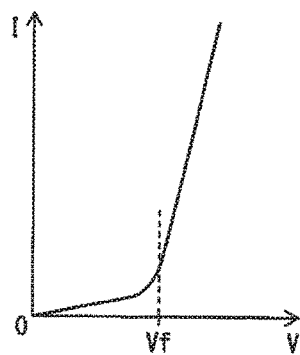
FIG. 17 is a graph illustrating a forward voltage of the bypass diodes shown in FIG. 16.

FIG. 16(b) is a circuit diagram that is obtained by adding the bypass diodes 72 to FIG. 4 (the equivalent circuit showing the solar cell string 3 with "R", "L", and "C", when the solar cell string 3 does not generate electric power). FIG. 16(c) is a circuit diagram that is obtained by adding the bypass diodes 72 to FIG. 5 (the equivalent circuit that corresponds to FIG. 4, and shows the solar cell string 3 when the solar cell string 3 generates electric power). FIG. 17 is a graph showing the forward voltage Vf of the bypass diodes 72 shown in FIG. 16.

As shown in FIG. 17, an electric current hardly flow through the bypass diodes 72 when a voltage that is smaller than the forward voltage Vf is applied. Accordingly, the inspection apparatus 11 uses, as the inspection signal 51, a signal having a voltage that is smaller than the forward voltage Vf of the bypass diodes 72. Accordingly, it is possible to accurately obtain an impedance Zp when the inspection signal is applied to the P terminal and an impedance Zn when the inspection signal is applied to the N terminal, and to perform a failure inspection on the solar cell string 3 with high accuracy.

Embodiment 6

Configuration in which Inspection Signal 51 is Generated Using Electric Power of Solar Cell String 3

Figure 18:
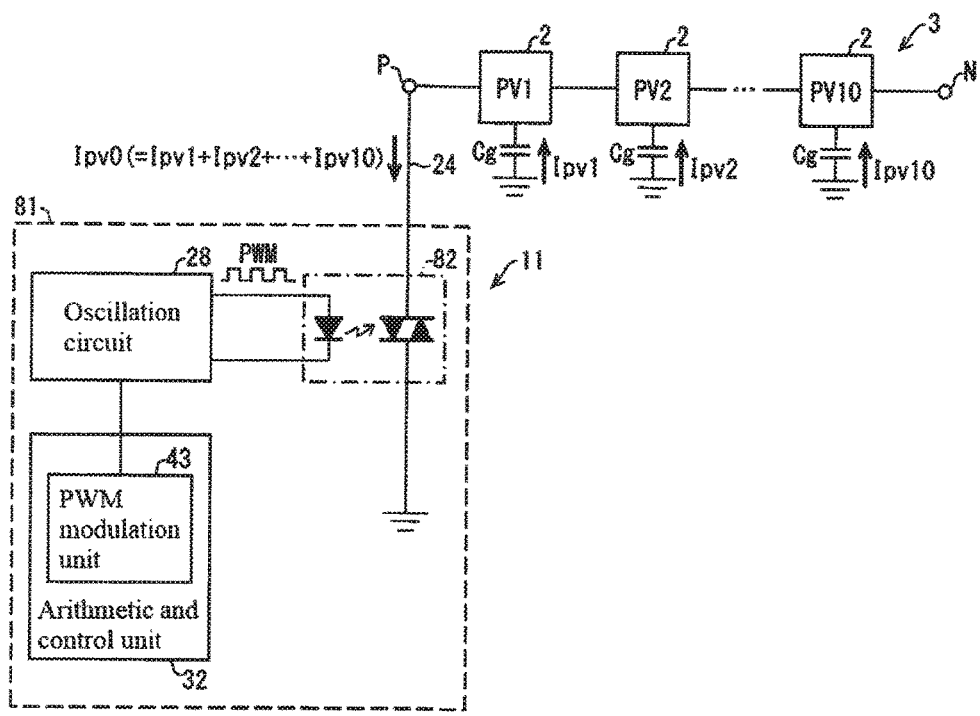
FIG. 18 is a circuit diagram illustrating a configuration of an inspection apparatus according to yet another embodiment of the present invention applying an inspection signal to the solar cell string.

The following will describe yet further embodiment of the present invention with reference to the drawing. An inspection apparatus 11 of the present embodiment uses electric power generated by the solar cell string 3 to generate an inspection signal 51. FIG. 18 is a circuit diagram showing a configuration of the inspection apparatus 11 of the present embodiment in which the inspection signal 51 is applied to the solar cell string 3.

As shown in FIG. 18, the inspection apparatus 11 of the present embodiment is provided with an inspection signal generating circuit 81. The inspection signal generating circuit 81 is constituted by the PWM modulation unit 43 of the arithmetic and control unit 32, the oscillation circuit (on-off driving unit) 28, and a solid state relay (SSR) 82.

The PWM modulation unit 43 controls, as described above, the oscillation circuit 28 to adjust the frequency of the signal produced by the oscillation circuit 28 to a frequency that is appropriate for an inspection signal. The oscillation circuit 28 produces a PWM signal that is to be supplied to the SSR 82. The SSR 35 is provided on the current path between the P terminal (in the case of FIG. 18) of the solar cell string 3 and a ground, and opens and closes the current path based on the PWM signal output from the oscillation circuit 28. Accordingly, it is possible to achieve a state in which the AC inspection signal 51 is applied to the P terminal of the solar cell string 3.

Note that FIG. 18 shows the case where the inspection signal is applied to the P terminal, and if the inspection signal is applied to the N terminal, the inspection signal generating circuit 81 is connected to the N terminal of the solar cell string 3. Furthermore, the SSR 82 is a switching element, and another switching element may be used in place thereof.

According to the above-described configuration, electric power of the solar cell string 3 is used to generate the inspection signal 51 to be applied to the solar cell string 3, and thus no additional power supply for generating the inspection signal 51 is needed. Accordingly, it is possible to realize downsizing of the inspection apparatus 11 at low cost.

Embodiment 7

Figure 19:
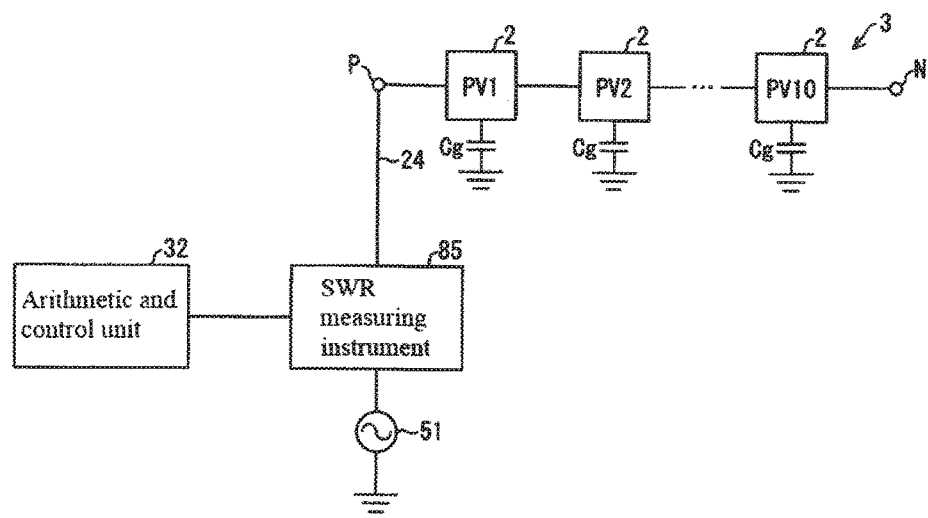
FIG. 19 is a circuit diagram illustrating a configuration of a main portion of an inspection apparatus according to yet another embodiment of the present invention.

Configuration in which Failure Inspection is Performed Using Standing Wave Ratio when Inspection Signal 51 is Applied The following will describe yet another embodiment of the present invention with reference to the drawing. An inspection apparatus 11 of the present embodiment is configured to measure a standing wave ratio (SWR) when an inspection signal 51 is applied to the solar cell string 3, and perform a failure inspection on the solar cell string 3 based on the obtained SWR (indicator value). FIG. 19 is a circuit diagram showing a configuration of a main portion of the inspection apparatus 11 of the present embodiment.

In the foregoing embodiments, the inspection apparatuses 11 are configured to obtain the impedance Zp of the solar cell string 3 when an inspection signal is applied to the P terminal, and the impedance Zn when an inspection signal is applied to the N terminal, and perform a failure inspection on the solar cell string 3 based on the obtained impedances Zp and Zn. In contrast, thereto, the inspection apparatus 11 of the present embodiment is configured to obtain standing wave ratios (or return losses) when an inspection signal is applied to the P terminal and when an inspection signal is applied to the N terminal, and perform a failure inspection on the solar cell string 3 based on the obtained standing wave ratios (or return losses).

In other words, the line path of the solar cell string 3 including a plurality of solar cell modules 2 can be regarded as a monopole antenna. Accordingly, if there is a failure in the solar cell string 3, SWRs are different between the case where the inspection signal is applied to the P terminal and the case where the inspection signal is applied to the N terminal. Therefore, the inspection apparatus 11 of the present embodiment uses the difference in SWR to perform a failure inspection on the solar cell string 3.

In this case, as shown in FIG. 19, the inspection apparatus 11 only needs to include, in the configuration shown in FIG. 1, an SWR measuring instrument 85 in place of the signal current measurement circuit 26, for example. The arithmetic and control unit 32 determines whether or not there is a cable disconnection in the solar cell string 3, and obtains a failure position in the solar cell string 3, based on the SWRs that were measured by the SWR measuring instrument (WR meter, for example) 85 when the inspection signal 51 was applied to the P terminal and when the inspection signal 51 was applied to the N terminal.

Furthermore, it is preferable that the frequency of the inspection signal 51 be set to a high frequency in, for example, the above-described range between 1 kHz and 1 MHz. Furthermore, it is preferable that the frequency of the inspection signal 51 be set so as to resonate to the line path, which is regarded as a monopole antenna, of the solar cell string 3. In this case, the wavelength of the inspection signal 51 is set to a wavelength such as, for example, one quarter-wavelength or one half-wavelength with respect to the length of the line path of the solar cell string 3. In such a configuration, SWR has a small value (1, for example) if the solar cell string 3 has not failed, whereas SWR has a large value if the solar cell string 3 has failed, and thus a failure inspection is easy.

Note that if there is a cable disconnection in the solar cell string 3, the applied inspection signal 51 is returned from the disconnection position to the position at which the inspection signal 51 is applied. On the other hand, if a solar cell module 2 has failed without a disconnection, and has a high resistance, part of the applied inspection signal 51 is returned from the failure position, and the remaining part passes through the failure position. In the failure inspection, it is preferable that the end terminal of the solar cell string 3 (the terminal opposite to the terminal at which the inspection signal 51 is applied) be connected to a ground via a shunt resistor. Accordingly, it is possible to reliably detect a cable disconnection in the solar cell string 3.

Embodiment 8

Figure 20:
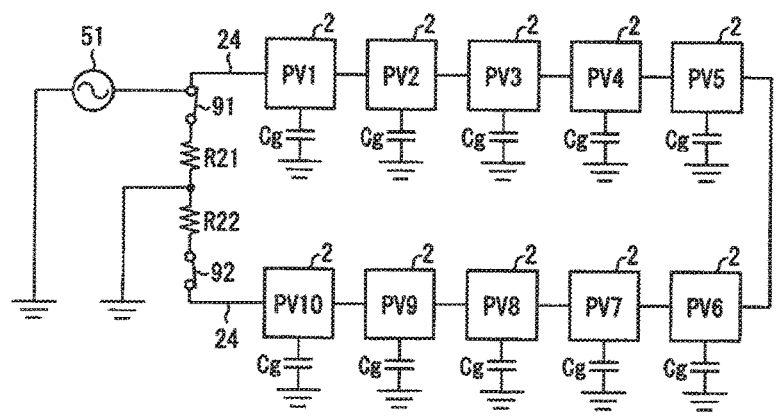
FIG. 20 is a circuit diagram illustrating a configuration of a main portion of an inspection apparatus according to yet another embodiment of the present invention.

Configuration in which Overall Impedance is Measured Based on Shorting of PN Terminals The following will describe yet another embodiment of the present invention with reference to the drawing. An inspection apparatus 11 of the present embodiment is configured to short the P terminal and the N terminal of the solar cell string 3, and measure an overall impedance of the solar cell string 3. FIG. 20 is a circuit diagram showing a configuration of a main portion of the inspection apparatus 11 of the present embodiment.

As shown in FIG. 20, the inspection apparatus 11 is configured to be able to short the P terminal and the N terminal of the solar cell string 3 via the resistors R21 and R22. Accordingly, a relay 91 for connecting/disconnecting the resistor R21 to/from the P terminal is provided between them, and a relay 92 for connecting/disconnecting the resistor R22 to/from the N terminal is provided between them. The connecting/disconnecting operation of the relays (shorting/non-shorting switching unit) 91 and 92 is controlled by the control unit 47 of the arithmetic and control unit 32.

In the above-described configuration, when a failure inspection is performed on the solar cell string 3, an impedance Zp when an inspection signal is applied to the P terminal and an impedance Zn when an inspection signal is applied to the N terminal are obtained in the above-described manner. Then, a position at which a solar cell module 2 has failed is obtained based on the impedances Zp and Zn.

On the other hand, if the impedances Zp and Zn have the same value, conceivable are a case where a cable disconnection or a failure of a solar cell module 2 has not occurred in the solar cell string 3, and a case where there is a cable disconnection or a failure of a solar cell module 2 at a central position of the solar cell string 3.

Accordingly, if the impedances Zp and Zn have the same value, the relays 91 and 92 are turned on, and an inspection signal 51 is applied to the P terminal or the N terminal to obtain an overall impedance Zpn of the solar cell string 3. The overall impedance Zpn can be obtained in the same manner as in the case of obtaining the impedances Zp and Zn even if there is a cable disconnection or a failure of a solar cell module 2 in the solar cell string 3.

Then, the overall impedance Zpn is compared with the impedance Zp or Zn, and if these impedances are different, the control unit 47 can determine that there is a cable disconnection or a failure of a solar cell module 2 at the central position of the solar cell string 3. Whereas, if both impedances have the same value, the control unit 47 can determine that the solar cell string 3 has not failed.

Embodiment 9

Configuration in which Frequency of Inspection Signal 51 is Changed Based on Value of Serial Resistance Rs The following will describe yet another embodiment of the present invention with reference to the drawings. An inspection apparatus 11 of the present embodiment is configured to change the frequency of the inspection signal 51 based on the value of the serial resistance Rs.

The serial resistance Rs of a solar cell module 2 is reduced with a deterioration of the solar cell module 2. If it is tried to detect even a failure in which the value of the serial resistance Rs is small, a difference between the serial resistance Rs of a normal solar cell module 2 and the serial resistance Rs of a faulty solar cell module 2 is reduced, and thus it is difficult to detect the faulty solar cell module 2 in the failure inspection performed on the solar cell string 3.

Accordingly, the inspection apparatus 11 changes the frequency of the inspection signal 51 based on the value of the serial resistance Rs of the solar cell module 2 to reduce the influence of the impedance of the capacitance on the impedance of the solar cell string 3 (so that it approaches 0) relatively so that the influence of the impedance of the serial resistance Rs thereon is increased. Specifically, the frequency of the inspection signal 51 is increased with a reduction in the resistance value of the serial resistance Rs.

In this case, a threshold may be set for the serial resistance Rs, and the frequency of the inspection signal 51 may be switched in multiple stages with the threshold used as a border. Furthermore, the frequency of the inspection signal 51 can be changed by the PWM modulation unit 43 of the inspection apparatus 11 shown in FIG. 1 controlling the oscillation circuit 28. Furthermore, the value of the serial resistance Rs of the solar cell module 2 can be obtained by a resistance value measurement unit of a conventionally known method, for example, the method disclosed in Patent Document 4.

According to the above-described configuration, even if the value of the serial resistance Rs of the solar cell module 2 is reduced, it is possible to detect a position at which a solar cell module 2 has failed with high accuracy.

Embodiment 10

Configuration in which Failure Inspection is Performed Only Using Measured Current The following will describe yet another embodiment of the present invention with reference to the drawings. In the inspection apparatuses 11 of the foregoing embodiments, when performing a failure inspection on the solar cell string 3, the impedance Zp when an inspection signal is applied to the P terminal and the impedance Zn when an inspection signal is applied to the N terminal are obtained, and the failure inspection is performed based on the impedances Zp and Zn.

In contrast, an inspection apparatus 11 of the present embodiment obtains, in a failure inspection that is performed on the solar cell string 3, measured currents (indicator values) when the inspection signal 51 is applied to the P terminal and when the inspection signal 51 is applied to the N terminal, and performs the failure inspection based on the measured currents.

The measured voltage values of the inspection signals 51 that are applied to the P terminal and to the N terminal are identical, and only the measured current values of the inspection signal 51 are different. Accordingly, instead of the impedances Zp and Zn, a measured current Ip when the inspection signal is applied to the P terminal, and a measured current In when the inspection signal is applied to the N terminal are used to perform a failure inspection on the solar cell string 3.

In this case, in the inspection apparatus 11 shown in FIG. 1, the impedance calculation unit 46 of the arithmetic and control unit 32 calculates the ratio of the measured currents Ip to In (Ip/(Ip+In):In/(Ip+In)), instead of the ratio of the impedances Zp to Zn (Zn/(Zp+Zn):Zp/(Zp+Zn)). The control unit 47 obtains a position at which a solar cell module 2 has failed, based on the ratio of the measured currents Ip to In (Ip/(Ip+In):In/(Ip+In)).

According to the above-described configuration, as with the inspection apparatuses 11 of the embodiments, it is possible to detect whether or not there is a failure in the solar cell string 3 and a failure position in the solar cell string 3 with high accuracy. Note that the configuration of the inspection apparatus 11 of the present embodiment (a method for inspecting a failure in the solar cell string 3) is also applicable to other embodiments.

Embodiment 11

Configuration in which Failure Inspection is Performed when Solar Cell String 3 does not Generate Electric Power The following will describe yet another embodiment of the present invention with reference to the drawings. In the foregoing embodiments, the inspection apparatuses 11 are configured to perform a failure inspection on the solar cell string 3 while the solar cell string 3 generates electric power. In contrast, in the present embodiment, an inspection apparatus 11 is configured to perform a failure inspection while the solar cell string 3 does not generate electric power.

Figure 2:
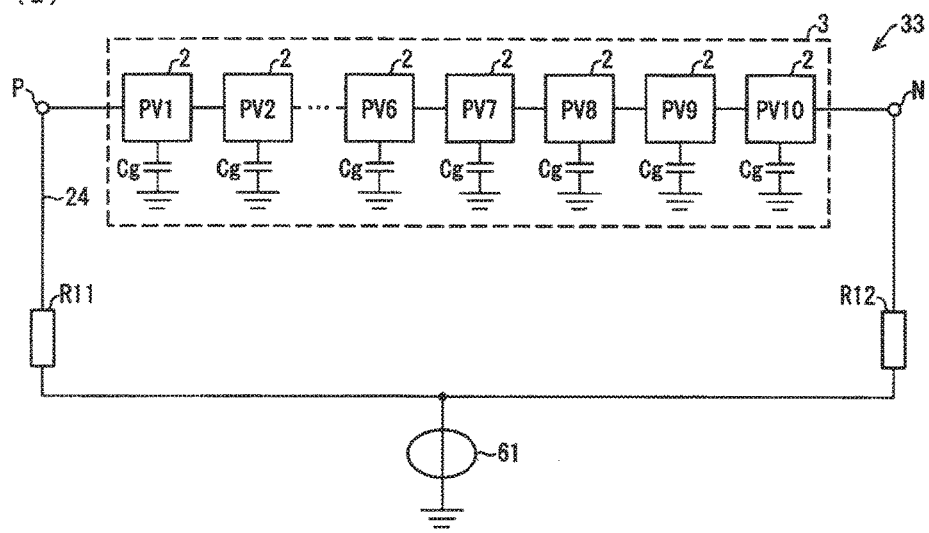
FIG. 2(a) is a circuit diagram illustrating a configuration of an earth fault inspection circuit that is provided on a solar cell string shown in FIG. 1.
FIG. 2(b) is a circuit diagram obtained by simplifying the circuit diagram of FIG. 2(a).
Figure 2:
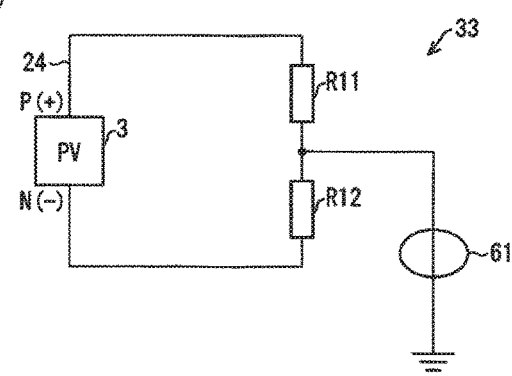
Figure 3:
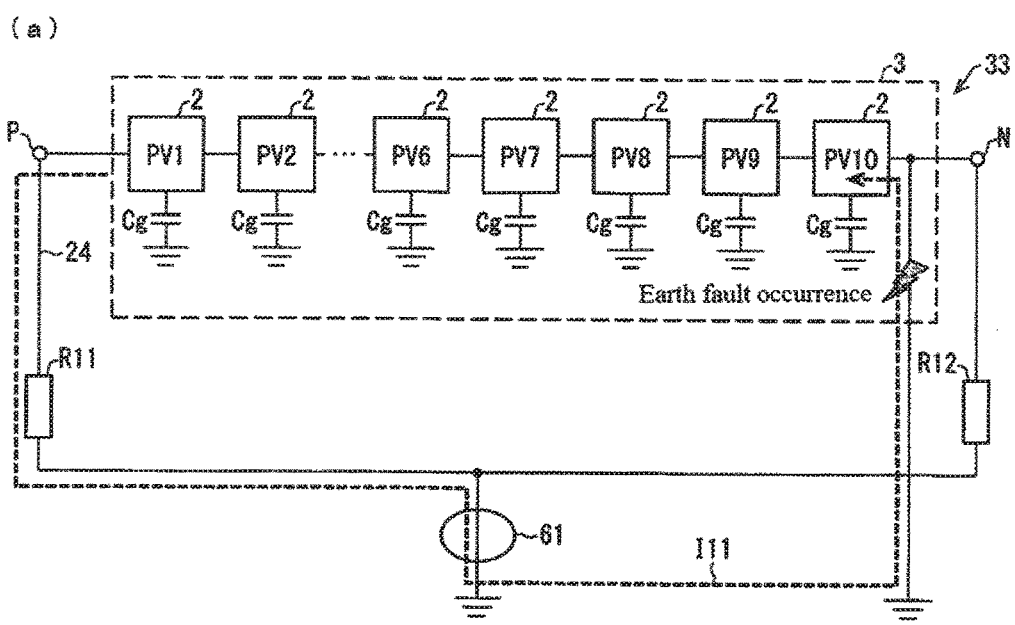
FIG. 3(a) is a circuit diagram illustrating a state in which an earth fault has occurred in the circuit of FIG. 2(a).
FIG. 3(b) is a circuit diagram obtained by simplifying the circuit diagram of FIG. 3(a).
Figure 3:
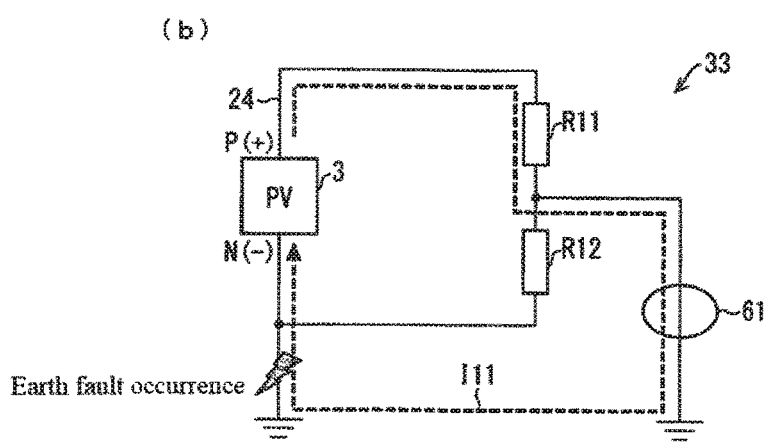

The equivalent circuit while the solar cell string 3 does not generate electric power is shown in FIG. 2. In this case, the capacitances Cd largely affect the impedance Zp when an inspection signal is applied to the P terminal, and the impedance Zn when an inspection signal is applied to the N terminal. Accordingly, in the present embodiment, in order to minimize the impedances due to the capacitances Cd, a signal having a frequency, in the range between 1 kHz and 1 MHz, that is higher (for example, 1 MHz) than that of a failure inspection that is performed during electric power generation is used as the inspection signal 51.

Note that the capacitances Cd of the solar cell modules 2 are different depending on the type of the solar cell modules 2, but in the solar cell string 3 using identical solar cell modules 2, the capacitances Cd of the solar cell modules 2 are substantially the same. Furthermore, the capacitances Cd of the solar cell modules 2 are connected in series to each other in the state in which the solar cell modules 2 are connected in series to each other. Accordingly, the impedance of the solar cell string 3 that is caused by the capacitance Cd increases with an increase in the number of the solar cell modules 2 that are connected in series to each other.

Furthermore, since the inspection apparatus 11 performs a failure inspection by calculating the ratio of the impedances Zp to Zn (Zn/(Zp+Zn):Zp/(Zp+Zn)), it is possible to reduce the influence of the capacitance Cp on an impedance inspection result even if there is an impedance due to the capacitance Cp.

Furthermore, the inspection apparatus 11 that performs a failure inspection on the solar cell string 3 when the solar cell string 3 does not generate electric power is inferior to the inspection apparatus 11 that performs a failure inspection on the solar cell string 3 while the solar cell string 3 generates electric power, in the accuracy of inspection of a failure position, due to the presence of the capacitances Cd. However, whether or not there is a cable disconnection can be determined by comparing the impedances Zp with Zn, and thus it is possible to detect whether or not there is a cable disconnection with high accuracy, similar to the case where a failure inspection is performed on the solar cell string 3 during electric power generation.

According to the above-described configuration, similar to the inspection apparatuses 11 of the foregoing embodiments, the inspection apparatus 11 of the present embodiment can detect whether or not there is a failure in the solar cell string 3, and a failure position in the solar cell string 3 with high accuracy. Note that the configuration of the inspection apparatus 11 of the present embodiment (a method for inspecting a failure in the solar cell string 3) is also applicable to other embodiments.

Overview

A solar photovoltaic system inspection apparatus of the present invention includes: an inspection signal generation unit configured to generate AC inspection signals; a connection switching unit configured to switch connection of the inspection signal generation unit so that the inspection signals are sequentially applied to a positive electrode of a solar cell string in which a plurality of solar cell modules are connected in series to each other, and to a negative electrode of the solar cell string; an indicator value measurement unit configured to measure an indicator value when the inspection signal is applied to the positive electrode, and an indicator value when the inspection signal is applied to the negative electrode, the indicator values varying depending on the number of solar cell modules from the electrode to which the inspection signal was applied to a failure position; and a failure position determination unit configured to obtain the failure position based on a ratio of the indicator value measured when the inspection signal was applied to the positive electrode, to the indicator value measured when the inspection signal was applied to the negative electrode.

According to the above-described configuration, the inspection signal generation unit generates AC inspection signals. The connection switching unit switches connection of the inspection signal generation unit so that the inspection signals are sequentially applied to the positive electrode of the solar cell string in which a plurality of solar cell modules are connected in series to each other, and to the negative electrode of the solar cell string. The indicator value measurement unit measures indicator values when the inspection signal is applied to the positive electrode and when the inspection signal is applied to the negative electrode. The indicator values vary depending on the number of solar cell modules from the electrode to which the inspection signal was applied to a failure position, and are, for example, impedances, electric currents that follow through the solar cell string by applying the inspection signals, or standing wave ratios. The failure position determination unit obtains the failure position based on a ratio of the indicator value measured when the inspection signal was applied to the positive electrode, to the indicator value measured when the inspection signal was applied to the negative electrode.

Accordingly, there is no need of measuring in advance an indicator value (for example, an impedance) of the solar cell string to be inspected in a state in which there is no failure, and it is possible to obtain the failure position in the solar cell string without using an indicator value (for example, an impedance) that was measured in advance, and changes daily due to the weather or the like. Accordingly, it is possible to perform a failure inspection on the solar cell string easily and with high accuracy.

The solar photovoltaic system inspection apparatus may further include: a state detection unit configured to detect whether or not the solar cell string is generating electric power; and a first control unit configured to control components including the inspection signal generation unit, the connection switching unit, the indicator value measurement unit, and the failure position determination unit so that, if it is detected by the state detection unit that the solar cell string is generating electric power, a failure inspection is performed on the solar cell string by operations of the components.

According to the above-described configuration, while the solar cell string generates electric power, an impedance such as a resistance or capacitance that is contained in the solar cell module is reduced, and slightly affects the indicator value measured when the inspection signal was applied to the positive electrode, and the indicator value measured when the inspection signal was applied to negative electrode. As a result, the circuit of the solar cell string in view of the impedance (indicator value) mainly includes only capacitances to earth for example, and is simplified. Therefore, according to the above-described configuration, it is possible to perform a failure inspection on the solar cell string with higher accuracy based on the ratio of the indicator value measured when the inspection signal was applied to the positive electrode, to the indicator value measured when the inspection signal was applied to the negative electrode.

In the solar photovoltaic system inspection apparatus, bypass diodes may be connected in parallel to the solar cell modules, and a voltage of the inspection signals may be set to a voltage that is not greater than a forward voltage of the bypass diodes.

According to the above-described configuration, the voltage of the inspection signals is set to a voltage that is not greater than a forward voltage of the bypass diodes of the solar cell module, and thus an electric current hardly flows through the bypass diodes. Accordingly, it is possible to obtain appropriate indicator values that correspond to the failure position in the solar cell string, when the inspection signals are applied respectively to the positive electrode and the negative electrode of the solar cell string, thus making it possible to perform a failure inspection with high accuracy.

The solar photovoltaic system inspection apparatus may further include: an earth fault inspection unit configured to perform an inspection of whether or not there is an earth fault in the solar cell string, the inspection being performed by the earth fault inspection unit prior to a failure inspection that is performed on the solar cell string by operating components including the inspection signal generation unit, the connection switching unit, the indicator value measurement unit, and the failure position determination unit; and a second control unit configured to cancel the failure inspection if an earth fault is detected by the earth fault inspection unit.

If an earth fault has occurred in the solar cell string, the indicator values that are respectively obtained, in the failure inspection that is performed on the solar cell string, when the inspection signal is applied to the positive electrode of the solar cell string and when the inspection signal is applied to the negative electrode thereof are inaccurate. Accordingly, it is not possible to perform a failure inspection on the solar cell string with high accuracy.

Accordingly, in the failure inspection that is performed on the solar cell string, it is preferable to inspect first whether or not there is an earth fault in the solar cell string, and to cancel the failure inspection if there is an earth fault. With this, it is possible to avoid a situation in which the solar cell string is performed in vain.

The solar photovoltaic system inspection apparatus may further include: a current measurement unit configured to measure an output current of the solar cell string; a path switching unit configured to switch an output path of the solar cell string between an electric power supplying path and an inspection path on which a failure inspection is performed on the solar cell string by operating components including the inspection signal generation unit, the connection switching unit, the indicator value measurement unit, and the failure position determination unit; and a third control unit configured to control the path switching unit to switch the output path of the solar cell string from the electric power supplying path to the inspection apparatus, when the failure inspection is to be performed on the solar cell string and the output current that was measured by the current measurement unit is not greater than a predetermined threshold.

According to the above-described configuration, the current measurement unit measures an output current of the solar cell string, and the third control unit controls the path switching unit to switch the output path of the solar cell string from the electric power supplying path to the inspection apparatus, when the failure inspection is to be performed on the solar cell string and the output current measured by the current measurement unit is not greater than a predetermined threshold.

Accordingly, when the output path of the solar cell string is switched, it is possible to eliminate any adverse impact caused by an occurrence of an arc, and to use a switching relay that is inexpensive and withstands a low voltage for example, making it possible to perform the switching operation easily and safely.

The solar photovoltaic system inspection apparatus may further include: an interelectrode measurement unit configured to measure an interelectrode voltage between the positive electrode and the negative electrode of the solar cell string, or an interelectrode current between the positive electrode and the negative electrode of the solar cell string; and a disconnection determination unit configured to determine that there is a disconnection in the solar cell string if the interelectrode current or the interelectrode voltage indicates a cable disconnection of the solar cell string.

According to the above-described configuration, the interelectrode measurement unit measures an interelectrode voltage between the positive electrode and the negative electrode of the solar cell string, or an interelectrode current between the positive electrode and the negative electrode. The disconnection determination unit determines that there is a disconnection in the solar cell string if the interelectrode current or the interelectrode voltage indicates a cable disconnection of the solar cell string. Accordingly, it is possible to detect a cable disconnection in the solar cell string easily and with high accuracy.

In the solar photovoltaic system inspection apparatus, the indicator value measurement unit may acquire the indicator values based on electric currents that are respectively measured when the inspection signal is applied to the positive electrode of the solar cell string and when the inspection signal is applied to the negative electrode of the solar cell string, or based on the electric currents and voltages that are respectively measured when the inspection signal is applied to the positive electrode of the solar cell string and when the inspection signal is applied to the negative electrode of the solar cell string, and the solar photovoltaic system inspection apparatus may further include a filter unit configured to perform filter processing of removing noise components from the electric currents, or from the electric currents and the voltages.

According to the above-described configuration, the filter unit performs filter processing of removing noise components from the electric currents that were respectively measured when the inspection signal is applied to the positive electrode of the solar cell string and when the inspection signal is applied to the negative electrode of the solar cell string, or from the electric currents and the voltages that were respectively measured when the inspection signal is applied to the positive electrode of the solar cell string and when the inspection signal is applied to the negative electrode of the solar cell string, the electric currents and voltages being used in the measurement of the indicator values by the indicator value measurement unit.

Accordingly, the indicator value measurement unit can acquire accurate indicator values, and as a result, it is possible to perform a failure inspection on the solar cell string with high accuracy.

In the solar photovoltaic system inspection apparatus, the indicator value measurement unit may be provided with a terminal impedance, and when the inspection signals are sequentially applied to the positive electrode and the negative electrode of the solar cell string, the electrode that is opposite to the electrode to which the inspection signal is applied may be grounded to a ground via the terminal impedance.

According to the above-described configuration, as a result of the electrode of the solar cell string that is opposite to the electrode to which the inspection signal is applied is connected to a ground via the impedance, the inspection signals, that is, the indicator values that are obtained by applying the inspection signals are not likely to be affected by noise. Accordingly, it is possible to obtain accurate indicator values, and to perform a failure inspection on the solar cell string with high accuracy.

The solar photovoltaic system inspection apparatus may further include: a string separation switching unit configured to switch the solar cell string between a state in which the solar cell string is separated into a plurality of smaller strings, and a state in which the solar cell string is not separated, wherein the connection switching unit switches connection of the inspection signal generation unit so that the inspection signals are sequentially applied to a positive electrode and a negative electrode of each of the smaller strings, and the first control unit controls components that includes the string separation switching unit, the inspection signal generation unit, the connection switching unit, the indicator value measurement unit, and the failure position determination unit so that a failure inspection is performed on each of the smaller strings by operating these components.

According to the above-described configuration, the string separation unit separates the solar cell string into a plurality of smaller strings, and each of the smaller strings is subjected to a failure inspection. Accordingly, even if there is a failure position in each smaller string, and there are the multiple failure positions as a whole in the solar cell string, it is possible to appropriately detect the failure positions.

The solar photovoltaic system inspection apparatus may further include: a resistance value measurement unit configured to measure a resistance value of a series resistance that is present in adjacent solar cell modules that are connected in series to each other, and are included in the solar cell modules of the solar cell string; and a frequency adjustment unit configured to increase a frequency of the inspection signals when a failure inspection is performed in a state in which the resistance value of the series resistance is smaller than a predetermined threshold, relative to when the failure inspection is performed in a state in which the resistance value of the series resistance is larger than the predetermined threshold, the failure inspection being performed on the solar cell string by operating components including the inspection signal generation unit, the connection switching unit, the indicator value measurement unit, and the failure position determination unit.

According to the above-described configuration, the resistance value measurement unit measures a resistance value of a series resistance that is present in adjacent solar cell modules that are connected in series to each other, and are included in the solar cell modules of the solar cell string. In the failure inspection that is performed on the solar cell string, the frequency adjustment unit increase a frequency of the inspection signals when the resistance value of the series resistance is smaller than a predetermined threshold, relative to when the resistance value of the series resistance is larger than the predetermined threshold.

The resistance value of a series resistance included in a solar cell modules gradually increases with a deterioration. Therefore, in an early period of the deterioration of the solar cell module, a difference in the resistance value of the series resistance between a normal solar cell module and a faulty solar cell module is small. It is thus difficult to detect the faulty solar cell module. Accordingly, the frequency of the inspection signals are increased when a failure inspection is performed on the solar cell string in a state in which the resistance value of the series resistance is small. Accordingly, the influence of the impedance of the capacitance on the impedance of the solar cell string is relatively reduced so that the influence of the impedance of the series resistance thereon is increased. As a result, even if the resistance value of a series resistance of a solar cell module is small, it is possible to detect a failure position in the solar cell string with high accuracy.

In the solar photovoltaic system inspection apparatus, the inspection signal generation unit may include: a switching element that has one end connected to a ground, and another end provided on a line path that is sequentially connected to the positive electrode and the negative electrode; and an on-off driving unit configured to cause the switching element to repeatedly perform on-off operations.

According to the above-described configuration, the inspection signals are generated by using electric power of the solar cell string. Accordingly, no separate power supply for generating inspection signals is needed. Accordingly, it is possible to realize downsizing of the configuration of the inspection signal generation unit for applying the inspection signals at low cost.

In the solar photovoltaic system inspection apparatus, the indicator value measurement unit may be provided with an additional impedance, the solar photovoltaic system inspection apparatus may further include a fourth control unit configured to control the inspection signal generation unit, the connection switching unit, the indicator value measurement unit, and the failure position determination unit, so that, if it is determined that there is no failure position in a first determination operation of the failure position determination unit obtaining the failure position, only the positive electrode or the negative electrode of the solar cell string is connected to a ground via the additional impedance, and the inspection signals are sequentially applied to the positive electrode and the negative electrode in the state in which only the positive electrode or the negative electrode of the solar cell string is connected to the ground via the additional impedance, and then a second determination operation is performed by the failure position determination unit, and in the second determination operation, the failure position determination unit may compare the indicator value measured when the inspection signal was applied to the positive electrode, with the indicator value measured when the inspection signal was applied to the negative electrode, and determine that the failure position in the solar cell string is located at a central position of the solar cell string if the indicator values are different from each other.

According to the above-described configuration, if it is determined that there is no failure position in the first determination operation of the failure position determination unit obtaining the failure position, only the positive electrode or the negative electrode of the solar cell string is connected to a ground via the additional impedance, and in this state, the inspection signals are sequentially applied to the positive electrode and the negative electrode, and then the second determination operation is performed by the failure position determination unit. In the second determination operation, the failure position determination unit compares the indicator value measured when the inspection signal was applied to the positive electrode, with the indicator value measured when the inspection signal was applied to the negative electrode, and determines that the failure position in the solar cell string is located at a central position of the solar cell string if the indicator values are different from each other.

Accordingly, even if there is a failure position in the solar cell string is located at the central position of the solar cell string, it is possible to detect the failure position with high accuracy.

In the solar photovoltaic system inspection apparatus, wherein the indicator values are impedances, or electric currents that flow through the solar cell string by applying the inspection signals, the solar photovoltaic system inspection apparatus further includes: a shorting/non-shorting switching unit configured to perform switching between a state in which the positive electrode and the negative electrode of the solar cell string are shorted, and a state in which both the positive electrode and the negative electrode are not shorted; and a fifth control unit configured to control the inspection signal generation unit, the connection switching unit, the indicator value measurement unit, the failure position determination unit, and the shorting/non-shorting switching unit, so that a first indicator value measuring operation of the indicator value measurement unit measuring the indicator value when the inspection signal is applied to the positive electrode, and the indicator value when the inspection signal is applied to the negative electrode is performed, and, if it is determined that there is no failure position in a first determination operation of the failure position determination unit obtaining the failure position, the solar cell string takes on the state in which both the positive electrode and the negative electrode are shorted, and an indicator value when the inspection signal is applied to the positive electrode or the negative electrode is measured in this state, and then a second determination operation is performed by the failure position determination unit, and in the second determination operation, the failure position determination unit compares the indicator value measured when the inspection signal was applied to the positive electrode or the indicator value measured when the inspection signal was applied to the negative electrode that was measured in the first indicator value measuring operation, with the indicator value that was measured in the state in which both the positive electrode and the negative electrode are not shorted, and determines that the failure position in the solar cell string is located at a central position of the solar cell string if the indicator values are different from each other.

According to the above-described configuration, the indicator values are impedances, or electric currents that flow through the solar cell string by applying the inspection signals. The fifth control unit controls the inspection signal generation unit, the connection switching unit, the indicator value measurement unit, the failure position determination unit, and the shorting/non-shorting switching unit, so that a first indicator value measuring operation of the indicator value measurement unit measuring the indicator value when the inspection signal is applied to the positive electrode, and the indicator value when the inspection signal is applied to the negative electrode is performed, and, if it is determined that there is no failure position in the first determination operation of the failure position determination unit obtaining the failure position, the solar cell string takes on the state in which both the positive electrode and the negative electrode are shorted, and an indicator value when the inspection signal is applied to the positive electrode or the negative electrode is measured in this state, and then the second determination operation is performed by the failure position determination unit. In the second determination operation, the failure position determination unit compares the indicator value measured when the inspection signal was applied to the positive electrode or the indicator value measured when the inspection signal was applied to the negative electrode in the first indicator value measuring operation, with the indicator value that was measured in the state in which both the positive electrode and the negative electrode are not shorted, and determines that the failure position in the solar cell string is located at the central position of the solar cell string if both indicator values are different from each other.

Accordingly, even if the failure position in the solar cell string is located at the central position of the solar cell string, it is possible to detect the failure position with high accuracy.

In the solar photovoltaic system inspection apparatus, the indicator values may be impedances.

According to the above-described configuration, the impedances are obtained based on the inspection signal voltages and the inspection signal currents when the AC inspection signals are sequentially applied to the positive electrode and the negative electrode of the solar cell string, and it is thus possible to perform, based on the impedances, a failure inspection on the solar cell string easily and with high accuracy.

In the solar photovoltaic system inspection apparatus, the indicator values may be electric currents that flow through the solar cell string by applying the inspection signals.

When the inspection signals are applied to the positive electrode and the negative electrode of the solar cell string, the voltages of the inspection signals are constant, and only the electric currents change. Accordingly, it is possible to set only the electric currents as the indicator values.

According to the above-described configuration, it is possible to perform a failure inspection on the solar cell string easily and with high accuracy, based on the inspection signal currents when the AC inspection signals are sequentially applied to the positive electrode and the negative electrode of the solar cell string. Furthermore, since only the electric currents of the inspection signals are used in the failure inspection that is performed on the solar cell string, it is possible to simplify the failure inspection on the solar cell string.

In the solar photovoltaic system inspection apparatus, the indicator values may be standing wave ratios.

According to the above-described configuration, standing wave ratios when the AC inspection signals are sequentially applied to the positive electrode and the negative electrode of the solar cell string are obtained, and it is possible to perform, based on the standing wave ratios, a failure inspection on the solar cell string easily and with high accuracy.

A solar photovoltaic system inspection method includes: an indicator value measuring step of sequentially applying AC inspection signals to a positive electrode and a negative electrode of a solar cell string in which a plurality of solar cell modules are connected in series to each other, and measuring an indicator value when the inspection signal is applied to the positive electrode, and an indicator value when the inspection signal is applied to the negative electrode, the indicator values varying depending on the number of solar cell modules from the electrode to which the inspection signal was applied to a failure position; and a determination step of obtaining the failure position based on a ratio of the indicator value measured when the inspection signal was applied to the positive electrode, to the indicator value measured when the inspection signal was applied to the negative electrode.

According to the above-described configuration, the solar photovoltaic system inspection method has the same functions and effects as those of the solar photovoltaic system inspection apparatus.

The present invention is not limited to the foregoing embodiments, and various modifications are possible within the claims, and embodiments that are obtained by appropriately combining the technical means disclosed in different embodiments are also included in the technical scope of the present invention.

INDUSTRIAL APPLICABILITY

The present invention is applicable to a failure inspection that is performed on a solar cell string of the solar photovoltaic system, the solar cell string being obtained by connecting solar cell modules in series to each other.

INDEX TO THE REFERENCE NUMERALS

1 Solar photovoltaic system
2 Solar cell module
3 Solar cell string
11 Inspection apparatus
21 PV voltage measurement circuit (state detection unit, interelectrode measurement unit)
22 PV current measurement circuit (state detection unit, interelectrode measurement unit)
23P Switching relay (path switching unit)
23N Switching relay (path switching unit)
24 Inspection current path
25 Switching relay (connection switching unit)
26 Signal current measurement circuit (indicator value measurement unit)
27 Signal injection circuit (inspection signal generation unit)
28 Oscillation circuit (inspection signal generation unit, on-off driving unit)
29 Filter circuit (filter unit)
31 Filter circuit (filter unit)
30 Signal voltage measurement circuit (indicator value measurement unit)
32 Arithmetic and control unit
33 Earth fault inspection circuit (earth fault inspection unit)
43 PWM modulation unit (inspection signal generation unit, frequency adjustment unit)
46 Impedance calculation unit (failure position determination unit)
47 Control unit (connection switching unit, failure position determination unit, first to fifth control units, disconnection determination unit, resistance value measurement unit)
51 Inspection signal
61 Current sensor
63 Cutout relay (string separation switching unit)
64 Switching relay (connection switching unit)
65 Switching relay (connection switching unit)
71 Solar cell
72 Bypass diode
81 Inspection signal generating circuit (inspection signal generation unit)
82 Solid state relay (SSR, switching element)
85 SWR measuring instrument
91 Relay (shorting/non-shorting switching unit)
92 Relay (shorting/non-shorting switching unit)
Rs Series resistance
Zt1 Terminal impedance
Zt2 Additional impedance

The invention claimed is:

1. A solar photovoltaic system inspection apparatus comprising:
a processor configured with a program to perform operations comprising:
operation as an inspection signal generation unit configured to generate AC inspection signals; and
operation as a connection switching unit configured to switch connection of the inspection signal generation unit so that the inspection signals are sequentially applied to a positive electrode of a solar cell string in which a plurality of solar cell modules are connected in series to each other, and to a negative electrode of the solar cell string; and
an indicator value measurement circuit that measures a first indicator value in response to the inspection signal being applied to the positive electrode, and a second indicator value in response to the inspection signal being applied to the negative electrode, the first and second indicator values varying depending on the number of solar cell modules from the electrode to which the inspection signal was applied to a failure position, wherein
the processor is configured with the program to perform operations further comprising operation as a failure position determination unit configured to obtain the failure position by comparing a first ratio of the first indicator value measured in response to the inspection signal being applied to the positive electrode, and a sum of the first and second indicator values, with a second ratio of the second indicator value measured in response to the inspection signal being applied to the negative electrode, and the sum of the first and second indicator values, and
a result of the comparison of the first and second ratios indicating the failure position.

2. The solar photovoltaic system inspection apparatus according to claim 1, further comprising:
a state detection circuit that detects whether the solar cell string is generating electric power, wherein
the processor is configured with the program to perform operations further comprising operation as a first control unit configured to control components comprising the inspection signal generation unit, the connection switching unit, the indicator value measurement circuit, and the failure position determination unit so that, in response to detecting, by the state detection circuit, that the solar cell string is generating electric power, a failure inspection is performed on the solar cell string by operations of the components.

3. The solar photovoltaic system inspection apparatus according to claim 1,
wherein bypass diodes are connected in parallel to the solar cell modules, and
a voltage of the inspection signals is set to a voltage that is not greater than a forward voltage of the bypass diodes.

4. The solar photovoltaic system inspection apparatus according to claim 1, further comprising:
an earth fault inspection circuit that performs an inspection of whether there is an earth fault in the solar cell string, the inspection being performed by the earth fault inspection circuit prior to a failure inspection that is performed on the solar cell string by operating components comprising:
the processor performing operations comprising the operations as: the inspection signal generation unit, the connection switching unit, and the failure position determination unit; and
the indicator value measurement circuit, wherein
the processor is configured with the program to perform operations further comprising operation as a second control unit configured to cancel the failure inspection in response to the earth fault being detected by the earth fault inspection circuit.

5. The solar photovoltaic system inspection apparatus according to claim 1, further comprising:
a path switching relay that switches an output path of the solar cell string between an electric power supplying path and an inspection path on which a failure inspection is performed on the solar cell string by operating components including the inspection signal generation unit, the connection switching unit, the indicator value measurement circuit, and the failure position determination unit, wherein
the processor is configured with the program to perform operations further comprising:
operation as a current measurement unit configured to measure an output current of the solar cell string; and
operation as a third control unit configured to control the path switching relay to switch the output path of the solar cell string from the electric power supplying path to the inspection apparatus, in response to the failure inspection being performed on the solar cell string and the output current that was measured by the current measurement unit being not greater than a predetermined threshold.

6. The solar photovoltaic system inspection apparatus according to claim 1, further comprising:
an interelectrode measurement circuit that measures an interelectrode voltage between the positive electrode and the negative electrode of the solar cell string, or an interelectrode current between the positive electrode and the negative electrode of the solar cell string wherein
the processor is configured with the program to perform operations further comprising operation as a disconnection determination unit configured to determine that there is a disconnection in the solar cell string in response to the interelectrode current or the interelectrode voltage indicating a cable disconnection of the solar cell string.

7. The solar photovoltaic system inspection apparatus according to claim 1, wherein
the indicator value measurement circuit acquires the first and second indicator values based on electric currents that are respectively measured in response to the inspection signal being applied to the positive electrode of the solar cell string and the inspection signal being applied to the negative electrode of the solar cell string, or based on the electric currents and voltages that are respectively measured in response to the inspection signal is applied to the positive electrode of the solar cell string and in response to the inspection signal being applied to the negative electrode of the solar cell string, and
the solar photovoltaic system inspection apparatus further comprises a filter circuit that performs filter processing of removing noise components from the electric currents, or from the electric currents and the voltages.

8. The solar photovoltaic system inspection apparatus according to claim 1, wherein
the indicator value measurement circuit is provided with a terminal impedance, and in response to the inspection signals being sequentially applied to the positive electrode and the negative electrode of the solar cell string, the electrode that is opposite to the electrode to which the inspection signal is applied is grounded to a ground via the terminal impedance.

9. The solar photovoltaic system inspection apparatus according to claim 1, further comprising:
a string separation switching relay that switches the solar cell string between a state in which the solar cell string is separated into a plurality of smaller strings, and a state in which the solar cell string is not separated, wherein
the processor is configured with the program to perform operations further comprising:
operation as the connection switching unit comprising operation as the connection switching unit switching connection of the inspection signal generation unit so that the inspection signals are sequentially applied to a positive electrode and a negative electrode of each of the smaller strings, and
operation as a first control unit controls that performs a failure inspection on each of the smaller strings by controlling components comprising:
the processor performing the operations comprising the operation as the string separation switching relay, the inspection signal generation unit, the connection switching unit, the failure position determination unit, and the indicator value measurement circuit so that a failure inspection is performed on each of the smaller strings.

10. The solar photovoltaic system inspection apparatus according to claim 1, wherein the processor is configured with the program to perform operations further comprising:
operation as a resistance value measurement unit configured to measure a resistance value of a series resistance that is present in adjacent solar cell modules that are connected in series to each other, and are included in the solar cell modules of the solar cell string; and
operation as a frequency adjustment unit configured to increase a frequency of the inspection signals in response to a failure inspection being performed in a state in which the resistance value of the series resistance is smaller than a predetermined resistance value threshold, relative to the failure inspection being performed in a state in which the resistance value of the series resistance is larger than the predetermined resistance value threshold, the failure inspection being performed on the solar cell string by controlling the operation of components comprising:
the processor performing operations comprising the operations as the inspection signal generation unit, the connection switching unit, and the failure position determination unit; and
the indicator value measurement circuit.

11. The solar photovoltaic system inspection apparatus according to claim 1, wherein
the inspection signal generation unit comprises:
a switching relay comprising one end connected to a ground, and another end provided on a line path sequentially connected to the positive electrode and the negative electrode; and an on-off driving circuit causing the switching relay to repeatedly perform on-off operations.

12. The solar photovoltaic system inspection apparatus according to claim 1, wherein
the indicator value measurement circuit comprises an additional impedance,
the processor is configured with the program to perform operations further comprising:
operation as a fourth control unit configured to control the inspection signal generation unit, the connection switching unit, the indicator value measurement circuit, and the failure position determination unit, so that, in response to determining that there is no failure position in a first determination operation of the failure position determination unit obtaining the failure position, only the positive electrode or the negative electrode of the solar cell string is connected to a ground via the additional impedance, and the inspection signals are sequentially applied to the positive electrode and the negative electrode in a state in which only the positive electrode or the negative electrode of the solar cell string is connected to the ground via the additional impedance, and performing a second determination operation by the failure position determination unit, and
in the second determination operation, operation as the failure position determination unit comprises operation as the failure position determination unit that compares the first indicator value measured in response to the inspection signal being applied to the positive electrode, with the second indicator value measured in response to the inspection signal being applied to the negative electrode, and determining the failure position in the solar cell string is located at a central position of the solar cell string if the first and second indicator values are different from each other.

13. The solar photovoltaic system inspection apparatus according to claim 1, wherein
the first and second indicator values comprise impedances, or electric currents that flow through the solar cell string by applying the inspection signals,
the solar photovoltaic system inspection apparatus further comprises:
a shorting/non-shorting switching relay that performs switching between a state in which the positive electrode and the negative electrode of the solar cell string are shorted, and a state in which both the positive electrode and the negative electrode are not shorted, and
the processor is configured with the program to perform operations further comprising:
operation as a fifth control unit configured to control the inspection signal generation unit, the connection switching unit, the indicator value measurement circuit, the failure position determination unit, and the shorting/non-shorting switching relay, so that a first indicator value measuring operation of the indicator value measurement circuit measuring the first indicator value in response to the inspection signal being applied to the positive electrode, and the second indicator value in response to the inspection signal being applied to the negative electrode is performed, and, in response to determining that there is no failure position in a first determination operation of the failure position determination unit obtaining the failure position, the solar cell string takes on the state in which both the positive electrode and the negative electrode are shorted, and a third indicator value in response to the inspection signal being applied to the positive electrode or the negative electrode is measured, and performing a second determination operation by the failure position determination unit, and
in the second determination operation, operation as the failure position determination unit comprises operation as the failure position determination unit that compares the first indicator value measured in response to the inspection signal being applied to the positive electrode or the second indicator value measured in response to the inspection signal being applied to the negative electrode that was measured in the first indicator value measuring operation, with the third indicator value that was measured in the state in which both the positive electrode and the negative electrode are not shorted, and that determines that the failure position in the solar cell string is located at a central position of the solar cell string if the third indicator value is different from the first or second indicator value.

14. The solar photovoltaic system inspection apparatus according to claim 1,
wherein the first and second indicator values comprise impedances.

15. The solar photovoltaic system inspection apparatus according to claim 1,
wherein the first and second indicator values comprise electric currents that flow through the solar cell string by applying the inspection signals.

16. The solar photovoltaic system inspection apparatus according to claim 1,
wherein the first and second indicator values comprise standing wave ratios.

17. A solar photovoltaic system inspection method comprising:
sequentially applying AC inspection signals to a positive electrode and a negative electrode of a solar cell string in which a plurality of solar cell modules are connected in series to each other, and measuring a first indicator value in response to the inspection signal being applied to the positive electrode, and a second indicator value in response to the inspection signal being applied to the negative electrode, the first and second indicator values varying depending on the number of solar cell modules from the electrode to which the inspection signal was applied to a failure position; and
obtaining the failure position by comparing a first ratio of the first indicator value measured in response to the inspection signal being applied to the positive electrode and a sum of the first and second indicator values with a second ratio of the second indicator value measured in response to the inspection signal being applied to the negative electrode and the sum of the first and second indicator values, a result of the comparison of the first and second ratios indicating the failure position.

* * * * *